United States Patent
Lee et al.

(10) Patent No.: US 8,637,917 B2
(45) Date of Patent: Jan. 28, 2014

(54) SEMICONDUCTOR DEVICES INCLUDING VERTICAL CHANNEL PATTERN

(75) Inventors: Ju-Yul Lee, Seoul (KR); Han-Mei Choi, Seoul (KR); Dong-Chul Yoo, Seongnam-si (KR); Young-Jong Je, Seoul (KR); Ki-Hyun Hwang, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 167 days.

(21) Appl. No.: 13/208,640

(22) Filed: Aug. 12, 2011

(65) Prior Publication Data

US 2012/0037977 A1    Feb. 16, 2012

(30) Foreign Application Priority Data

Aug. 13, 2010   (KR) .................. 10-2010-0078387

(51) Int. Cl.
*H01L 27/105* (2006.01)

(52) U.S. Cl.
USPC .... 257/324; 257/314; 257/774; 257/E29.309; 257/E21.081; 257/E21.21

(58) Field of Classification Search
None
See application file for complete search history.

(56) References Cited

U.S. PATENT DOCUMENTS

| | | | | |
|---|---|---|---|---|
| 5,739,567 | A * | 4/1998 | Wong ............................. | 257/316 |
| 2003/0077866 | A1* | 4/2003 | Kamath et al. ................ | 438/275 |
| 2007/0122981 | A1* | 5/2007 | Park .............................. | 438/275 |
| 2009/0230458 | A1 | 9/2009 | Ishiduki et al. | |
| 2010/0171163 | A1* | 7/2010 | Kim et al. ..................... | 257/314 |
| 2010/0200907 | A1* | 8/2010 | Yoo et al. ..................... | 257/324 |
| 2011/0147823 | A1* | 6/2011 | Kuk et al. ..................... | 257/324 |
| 2012/0049267 | A1* | 3/2012 | Jung ............................. | 257/324 |

FOREIGN PATENT DOCUMENTS

| | | |
|---|---|---|
| JP | 2009224466 A | 10/2009 |
| KR | 20090047614 A | 5/2009 |
| KR | 2010-0001547 A | 1/2010 |

* cited by examiner

*Primary Examiner* — Minh-Loan T Tran
*Assistant Examiner* — Fazli Erdem
(74) *Attorney, Agent, or Firm* — Harness, Dickey & Pierce, P.L.C.

(57) ABSTRACT

An insulating pattern is disposed on a surface of a semiconductor substrate and includes a silicon oxynitride film. A conductive pattern is disposed on the insulating pattern. A data storage pattern and a vertical channel pattern are disposed within a channel hole formed to vertically penetrate the insulating pattern and the conductive pattern. The data storage pattern and the vertical channel pattern are conformally stacked along sidewalls of the insulating pattern and the conductive pattern. A concave portion is formed in the semiconductor substrate adjacent to the insulating pattern. The concave portion is recessed relative to a bottom surface of the insulating pattern.

20 Claims, 18 Drawing Sheets

I-I'

II-II'

I-I'

II-II'

SEMICONDUCTOR DEVICES INCLUDING VERTICAL CHANNEL PATTERN

CROSS-REFERENCE TO RELATED APPLICATION

This application claims priority under 35 U.S.C. §119 to Korean Patent Application No. 10-2010-0078387 filed on Aug. 13, 2010, the entire contents of which is hereby incorporated by reference.

BACKGROUND

1. Field

Example embodiments of inventive concepts relate to semiconductor devices including vertical channel patterns, methods of manufacturing the same and information processing systems.

2. Description of Related Art

In recent years, semiconductor devices including vertical channel patterns have been fabricated to increase integration density.

SUMMARY

Example embodiments provide semiconductor devices including one or more vertical channel patterns.

Example embodiments provide information processing systems including one or more semiconductor devices having vertical channel patterns.

Example embodiments provide methods of fabricating semiconductor devices including one or more vertical channel patterns.

At least one example embodiment provides a semiconductor device. The semiconductor device includes: an insulating pattern disposed on a surface of a semiconductor substrate; a conductive pattern disposed on the insulating pattern; a data storage pattern and a vertical channel pattern disposed within a channel hole formed to vertically penetrate the insulating pattern and the conductive pattern; and a concave portion formed in the semiconductor substrate adjacent to the insulating pattern. The insulating pattern includes a silicon oxynitride film. The data storage pattern and the vertical channel pattern are conformally stacked along sidewalls of the insulating pattern and the conductive pattern. The concave portion is recessed relative to a bottom surface of the insulating pattern.

According to at least some example embodiments, the insulating pattern may include a lower silicon oxide film disposed under the silicon oxynitride film. The insulating pattern may include an upper silicon oxide film disposed above the silicon oxynitride film. The insulating pattern may include a silicon nitride film.

According to at least some example embodiments, the silicon oxynitride film may include nitrogen atoms at greater than or equal to about 13 atomic percent (at %).

According to at least some example embodiments, the silicon oxynitride film may include nitrogen atoms at less than or equal to about 21 at %.

According to at least some example embodiments, the silicon oxynitride film may include nitrogen atoms at between about 13 at % and about 21 at %, inclusive.

The silicon oxynitride film may be formed to a thickness of less than or equal to about 100 Å.

The concave portion may be spaced apart from the channel hole, and may be aligned with a sidewall of the insulating pattern. The data storage pattern and the vertical channel pattern direct contact the surface of the semiconductor substrate.

The data storage pattern may be disposed on the semiconductor substrate, and the vertical channel pattern may extend below the surface of the semiconductor substrate.

The data storage pattern may include silicon nitride and/or the vertical channel pattern may include polysilicon (poly-Si).

At least one other example embodiment provides a semiconductor device including: a ground selection transistor disposed on a semiconductor substrate; a plurality of memory cell transistors stacked on the ground selection transistor; a string selection transistor disposed on the plurality of memory cell transistors; a bit line disposed on the string selection transistor; an insulating pattern disposed between the semiconductor substrate and the ground selection transistor; and a concave portion formed in the semiconductor substrate adjacent to the insulating pattern. The insulating pattern includes silicon oxynitride.

According to at least some example embodiments, the semiconductor device may further include: a data storage pattern, a vertical channel pattern, and an insulating filling pattern configured to fill a channel hole penetrating the string selection transistor, the plurality of memory cell transistors, and the ground selection transistor. The concave portion may be formed in a source region of the ground selection transistor. The concave portion may be formed in a source region of the ground selection transistor.

A portion of the semiconductor substrate formed under the insulating pattern may be a channel region of the ground selection transistor. A portion of the vertical channel pattern may be a drain region of the ground selection transistor.

According to at least some example embodiments, the semiconductor device may further include: a data storage pattern, a vertical channel pattern, and a filling pattern. The data storage pattern may conformally cover a sidewall of a channel hole penetrating the string selection transistor, the plurality of memory cell transistors, and the ground selection transistor. The vertical channel pattern and the filling pattern may sequentially cover a sidewall of the data storage pattern and extend below a surface of the semiconductor substrate. The vertical channel pattern may conformally cover the data storage pattern and contact a bottom surface of the insulating pattern under the surface of the semiconductor substrate.

At least one other example embodiment provides a semiconductor device including: a first transistor and a second transistor disposed directly on a semiconductor substrate; and a structure disposed in the first and second transistors. The first transistor includes: a first insulating pattern disposed directly on the semiconductor substrate; and a first conductive pattern disposed on the first insulating pattern. The second transistor includes: a second insulating pattern disposed directly on the semiconductor substrate; and a second conductive pattern disposed on the second insulating pattern. The structure includes: data storage patterns disposed to vertically penetrate the first and second transistors; vertical channel patterns disposed on the data storage patterns, respectively; and filling patterns surrounded by the vertical channel patterns, respectively. Each of the first and second insulating patterns includes a silicon oxynitride film. The vertical channel patterns have one of a shape contacting a surface of the semiconductor substrate and a shape extending from the surface of the semiconductor substrate to the interior thereof. Also, the semiconductor substrate includes a concave portion aligned with a sidewall of each of the insulating patterns.

At least one other example embodiment provides a semiconductor device including: a stack structure including a silicon oxynitride layer and a conductive layer formed sequentially on a surface of a semiconductor substrate, the stack structure having a channel hole formed through the silicon oxynitride layer and the conductive layer; a data storage layer formed on sidewalls of the channel hole; and a vertical channel layer formed on the data storage layer.

According to at least some example embodiments, the silicon oxynitride layer may include nitrogen atoms at greater than or equal to about 13 atomic weight percent (at %). Alternatively, the silicon oxynitride layer may include nitrogen atoms at less than or equal to about 21 at %. Alternatively, the silicon oxynitride layer may include nitrogen atoms between about 13 at % and about 21 at %, inclusive. The silicon oxynitride layer may be in direct contact with the surface of the substrate and the conductive layer.

BRIEF DESCRIPTION OF THE DRAWINGS

Example embodiments of inventive concepts will be apparent from the more particular description of the example embodiments illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section.

Spatially relative terms, such as "lower," "upper," "in the vicinity of," "under," "adjacent to," "on" and the like, may be used herein for ease of description to describe one element or feature's relationship to another element(s) or feature(s) as illustrated in the figures.

Also, the terminology used herein is for the purpose of describing particular embodiments only and is not intended to be limiting of the inventive concept.

Hereinafter, a transistor and a semiconductor device including a vertical channel pattern according to example embodiments will be described with the appended drawings. In this case, the transistor may be described as a component of the semiconductor device along with the semiconductor device. The semiconductor device may refer to a flash memory device.

Figure 1:
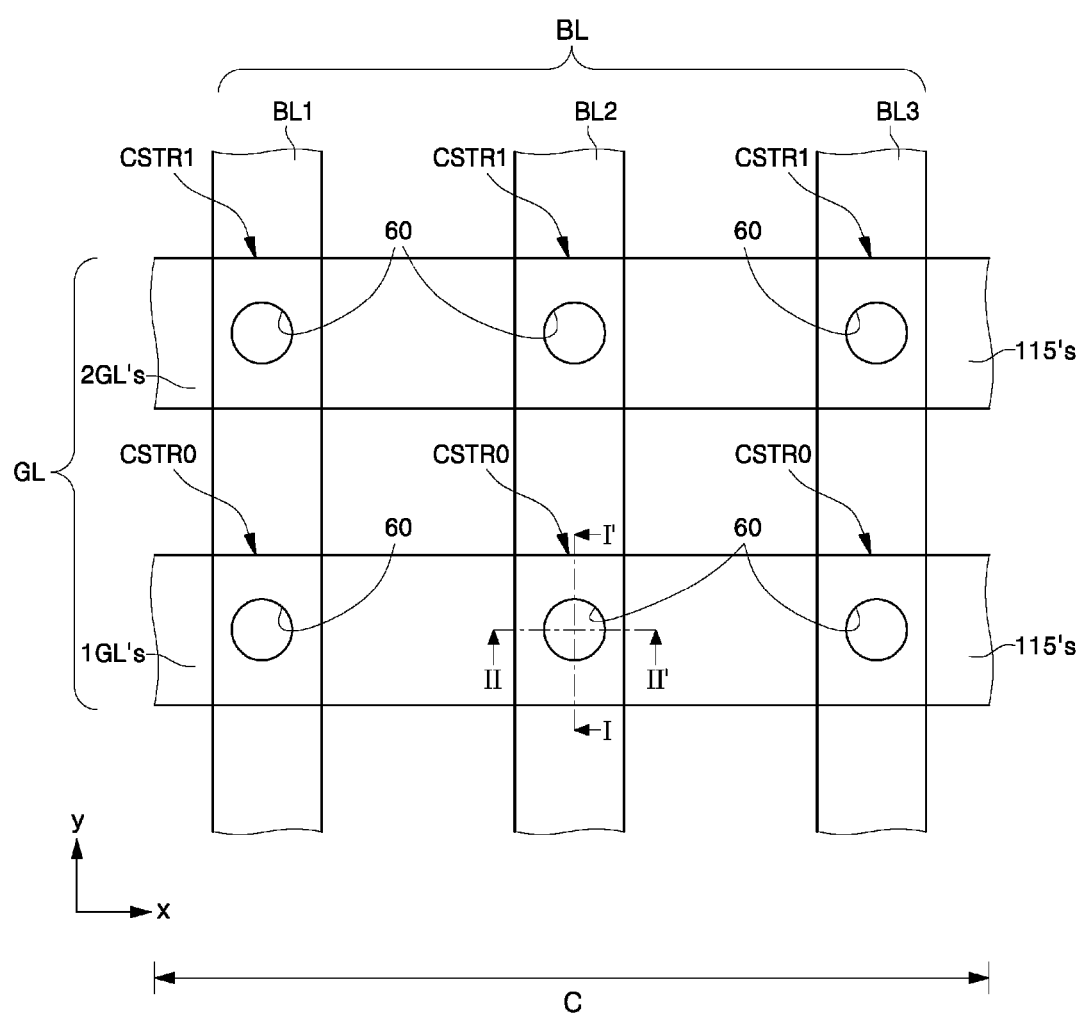
FIG. 1 is a layout showing a semiconductor device according to an example embodiment.
Figure 2:
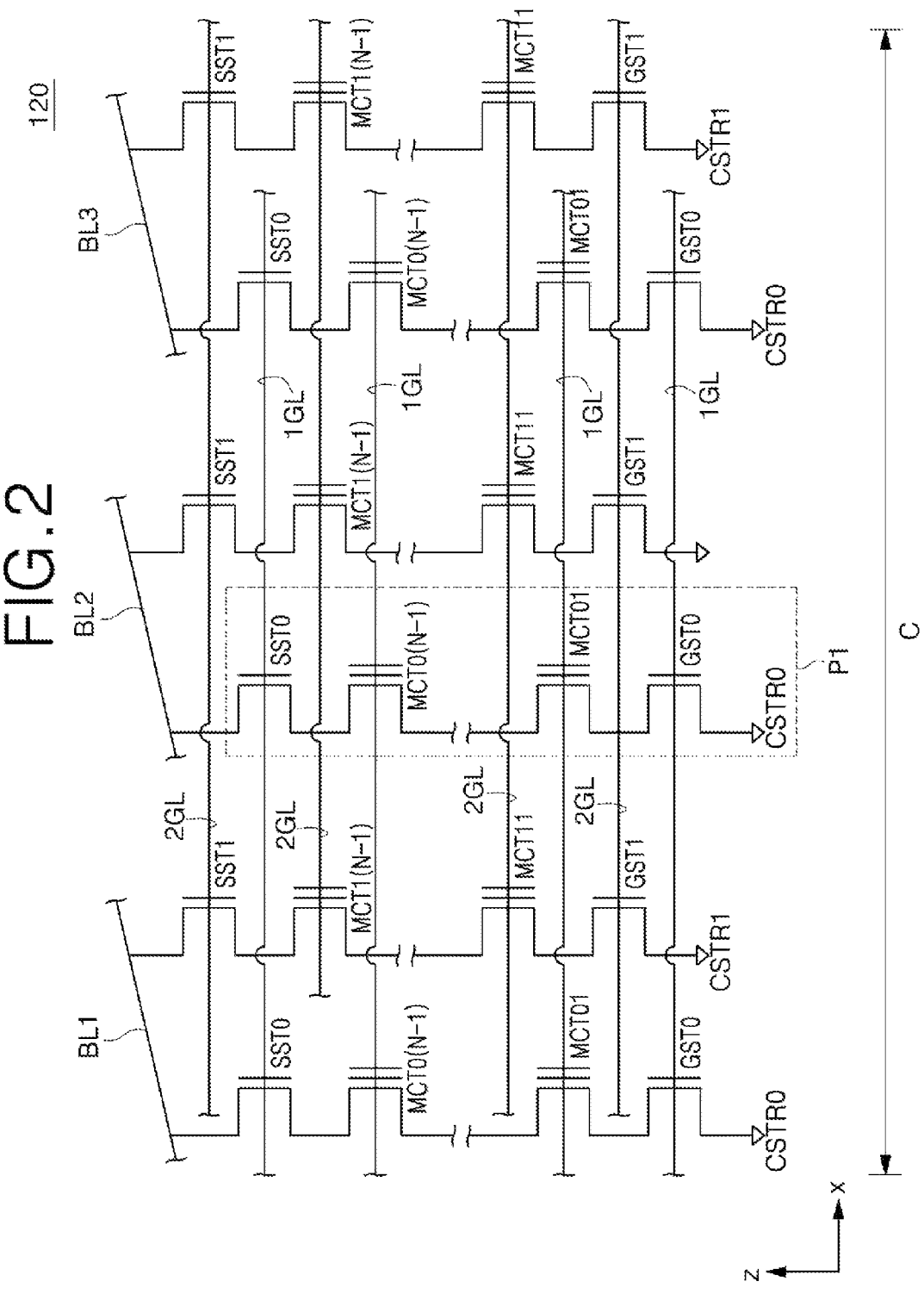
FIG. 2 is a circuit diagram showing the semiconductor device of FIG. 1.

FIG. 1 is an example layout of a semiconductor device according to an example embodiment. FIG. 2 is a circuit diagram showing the semiconductor device of FIG. 1.

Referring to FIGS. 1 and 2, a semiconductor device 120 includes a cell array region C in which gate lines GL and bit lines BL are arranged. The plan view in FIG. 1 shows a first gate line and a second gate line disposed at the same or substantially the same level in the semiconductor device 120. In this example, the first and second gate lines and are disposed parallel to each other in an X or Y direction. The X or Y direction may be a horizontal direction with respect to a top surface of a sheet of FIG. 1. In alternative example embodiments, the first and second gate lines and may be disposed at different levels and/or may not be parallel to each other.

Each of the gate lines GL in FIG. 1 represents a gate line group. For example, the gate lines GL include a first gate line group 1GL's in a region of the semiconductor device 120. As shown in FIG. 2, the first gate line group 1GL's includes a first gate line 1GL disposed at each different level in the vertical or Z direction. In other words, for example, the first gate line group 1GL's includes a plurality of first gate lines 1GL stacked in a vertical direction. The Z direction may be perpendicular or substantially perpendicular to the X and Y directions. Selected ones of the gate lines 1GL of the first gate line group 1GL's may have the same or substantially the same electric potential.

The gate lines GL also include a second gate line group 2GL's in another region of the semiconductor device 120. As shown in FIG. 2, for example, the second gate line group 2GL's includes a second gate line 2GL disposed at each different level in the vertical or Z direction. In other words, for example, the second gate line group 2GL's may include a plurality of second gate lines 2GL stacked in the vertical or Z direction. Selected ones of the gate lines 2GL of the second gate line group 2GL's may have the same or substantially the same electric potential.

The semiconductor device 120 may include at least three bit lines BL. In the example embodiment shown in FIG. 1, the bit lines BL include first through third bit lines BL1, BL2, and BL3 disposed at the same or substantially the same level in the semiconductor device 120. The first through third bit lines BL1, BL2, and BL3 may be parallel or substantially parallel to one another in the X or Y direction. In alternative example embodiments, the first through third bit lines BL1, BL2, and BL3 may not be parallel to one another in the X or Y direction and/or at the same or substantially the same level in the semiconductor device 120.

Still referring to FIGS. 1 and 2, the first through third bit lines BL1, BL2, and BL3 intersect the first and second gate line groups 1GL's and 2GL's. Channel holes 60 are disposed at intersections between the first through third bit lines BL1, BL2, and BL3 and the first and second gate line groups 1GL's and 2GL's.

Figure 3:
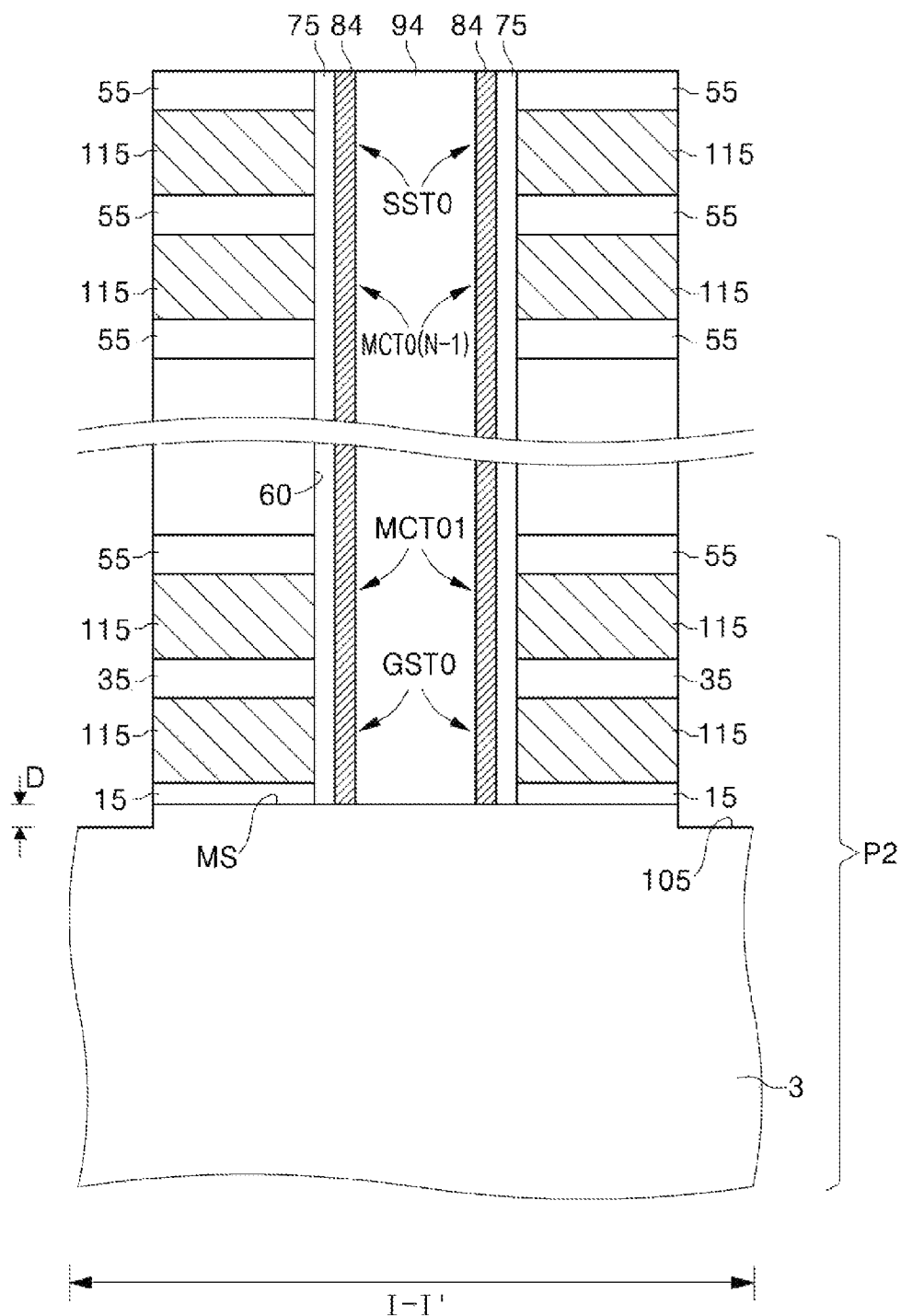
FIG. 3 is a cross-sectional view showing a cell string of a semiconductor device taken along line I-I' of FIG. 1 to correspond to P1 of FIG. 2.

As shown in FIG. 3, the channel holes 60 penetrate the first and second gate line groups 1GL's and 2GL's. The first and second gate line groups 1GL's and 2GL's may be electrically coupled to the first through bit lines BL1, BL2, and BL3 through the channel holes 60. Thus, in this example embodiment, the first gate line group 1GL's penetrates the first through third bit lines B1, B2, and B3 and defines first cell strings CSTR0 as shown in FIG. 2 in the vicinity or area of the channel holes 60.

Similarly, the second gate line group 2GL's penetrates the first through third bit lines B1, B2, and B3 and defines second cell strings CSTR1 of FIG. 2 in the vicinity or area of the channel holes 60.

Referring to FIG. 2, the bit lines BL1, BL2, and BL3 are disposed at the same or substantially the same level in the X or Y direction. Each of the bit lines BL1, BL2, and BL3 is electrically connected to first and second cell strings CSTR0 and CSTR1 in the X and Z directions or the Y and Z directions. Each first cell string CSTR0 includes a first string selection transistor SST0 and a first ground selection transistor GST0.

Each first cell string CSTR0 further includes a plurality of first memory cell transistors MCT01, . . . , and MCT0(N-1)) connected serially between the first string selection transistor SST0 and the first ground selection transistor GST0.

The first memory cell transistors MCT01, . . . , and MCT0 (N-1) are electrically coupled to the first string selection transistor SST0 and the first ground selection transistor GST0 through channel holes 60. In this case, the first ground selection transistor GST0, the first memory cell transistors MCT01, . . . , and MCT0(N-1), and the first string selection transistor SST0 have a plurality of first gate lines 1GL disposed at different levels in the Z direction.

Additionally, each second cell string CSTR1 includes a second string selection transistor SST1 and a second ground selection transistor GST1. Each second cell string CSTR1 further includes second memory cell transistors MCT11, . . . , and MCT1(N-1) connected serially between the second string selection transistor SST1 and the second ground selection transistor GST1.

In this example, the second memory cell transistors MCT11, . . . , and MCT1(N-1) are electrically coupled to the second string selection transistor SST1 and the second ground selection transistor GST1 through the channel holes 60. In this case, the second ground selection transistor GST1, the second memory cell transistors MCT11, . . . , and MCT1 (N-1), and the second ground selection transistor GST1 have a plurality of second gate lines 2GL disposed in the Z direction.

FIG. 3 is a cross-sectional view showing a first cell string CSTR0 of a semiconductor device taken along line I-I' in FIG. 1 and corresponding to P1 in FIG. 2.

Referring to FIG. 3, the first cell string CSTR0 includes first through third insulating patterns 15, 35, and 55 and conductive patterns 115 disposed on the semiconductor substrate 3. The first insulating pattern 15 contacts a main surface MS of the semiconductor substrate 3 and includes at least one layer. The second and third insulating patterns 35 and 55 are sequentially stacked on the first insulating pattern 15.

The conductive patterns 115 are formed among the first through third insulating patterns 15, 35, and 55. The conductive patterns 115 define the gate line groups (e.g., 1GL's and 2GL's) shown in FIG. 1 and/or FIG. 2. A data storage pattern 75, a vertical channel pattern 84, and a filling pattern 94 are disposed on sidewalls of the first through third insulating patterns 15, 35, and 55 and the conductive patterns 115. More specifically, for example, the data storage pattern 75, the vertical channel pattern 84, and the filling pattern 94 are formed on a sidewall of the channel hole 60 formed through the first through third insulating patterns 15, 35, and 55 and the conductive patterns 115.

In this example, the data storage pattern 75 and the vertical channel pattern 84 are sequentially stacked in a cylindrical shape along the sidewalls of the first through third insulating patterns 15, 35, and 55 and the conductive patterns 115 from the sidewall of the channel hole 60 toward the center thereof. The data storage pattern 75 is configured to store charges. The filling pattern 94 is formed on the sidewall of the vertical channel pattern 84 to fill the channel hole 60. The data storage pattern 75, the vertical channel pattern 84, and the filling pattern 94 contact the main surface MS of the semiconductor substrate 3. Thus, the conductive patterns 115 correspond to transistors, respectively. The data storage pattern 75 is a charge trap pattern. Although the example embodiment shown in FIG. 3 is described with regard to a cylindrical shape, example embodiments are not limited thereto. Rather, polygonal shapes other than a cylindrical or substantially cylindrical shape may be used.

Still referring to FIG. 3, the first cell string CSTR0 includes the first ground selection transistor GST0, the first memory cell transistors MCT01, . . . , and MCT0(N-1), and the first string selection transistor SST0. The first ground selection transistor GST0 includes a channel region disposed in the semiconductor substrate 3 under the first insulating pattern 15. Each of the first memory cell transistors MCT01, . . . , and MCT0(N-1) and the first string selection transistor SST0 have a channel region disposed in the vertical channel pattern 75.

Concave portions 105 are formed in the semiconductor substrate 3 adjacent to each side of the first cell string CSTR0. The concave portions 105 may be recessed to a given, desired or predetermined depth D from the main surface MS of the semiconductor substrate 3. In this example embodiment, each of the concave portions 105 corresponds to a source region of the first ground selection transistor GST0. That is, for example, each of the concave portions 105 may be disposed on and/or surrounded by the source region of the first ground selection transistor GST0. The source region may be a region of the semiconductor substrate 3 into which impurity ions, such as phosphorus (P) or arsenic (As) ions, are implanted.

More specifically, according to at least some example embodiments, the concave portions 105 may be formed in portions of the semiconductor substrate 3 between neighboring first and second strings CSTR0 and CSTR1 of FIG. 1 or FIG. 2. The concave portions 105 may be respectively disposed in source regions between the first and second ground selection transistors GST0 and GST1 of neighboring first and second strings CSTR0 and CSTR1. Also, the concave portions 105 may be formed in the semiconductor substrate 3 along the first through third insulating patterns 15, 35, and 55 and the conductive patterns 115. The concave portions 105 may intersect the bit lines BL1, BL2, and BL3 of FIG. 1 or FIG. 2.

Still referring to FIGS. 1 through 3, each of the first and second ground selection transistors GST0 and GST1 has a drain region disposed in the vertical channel pattern 84. A portion of the semiconductor substrate 3 corresponding to the first insulating pattern 15 corresponds to a channel region of each of the first and second ground selection transistors GST0 and GST1.

Hereinafter, a method of forming a cell string of a semiconductor device according to an example embodiment will be described with reference to FIGS. 4A through 16B.

FIGS. 4A through 10B are cross-sectional views illustrating a method of forming a cell string according to an example embodiment. The cross-sectional views are taken along lines I-I' and II-II' of FIG. 1 to correspond to P2 in FIG. 3.

Figure 4A:
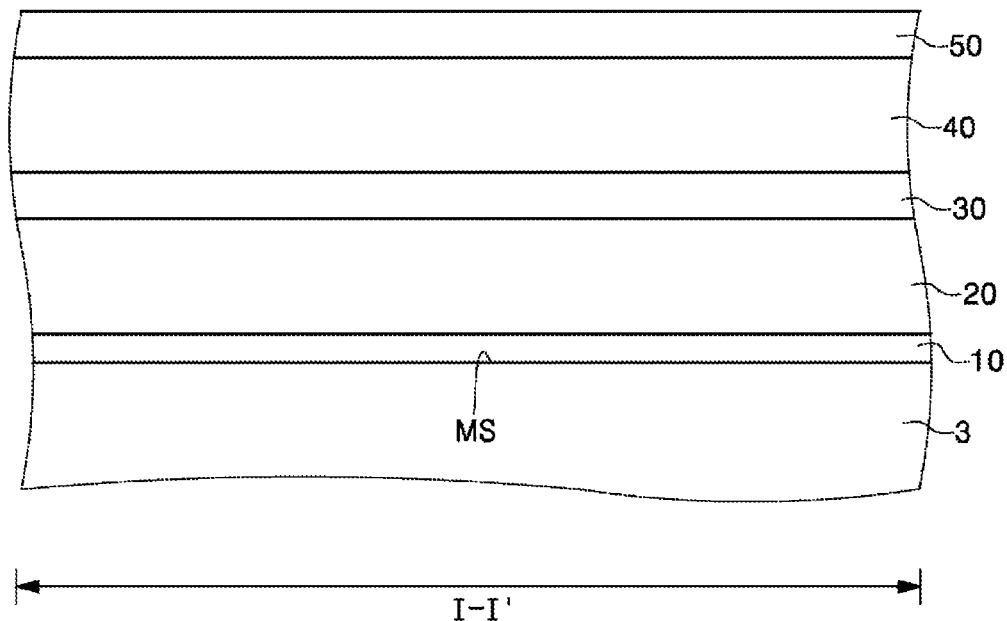
FIGS. 4A through 10B are cross-sectional views illustrating a method of forming a cell string according to an example embodiment, which are taken along lines I-I' and II-II' of FIG. 1 to correspond to P2 of FIG. 3.
Figure 4B:
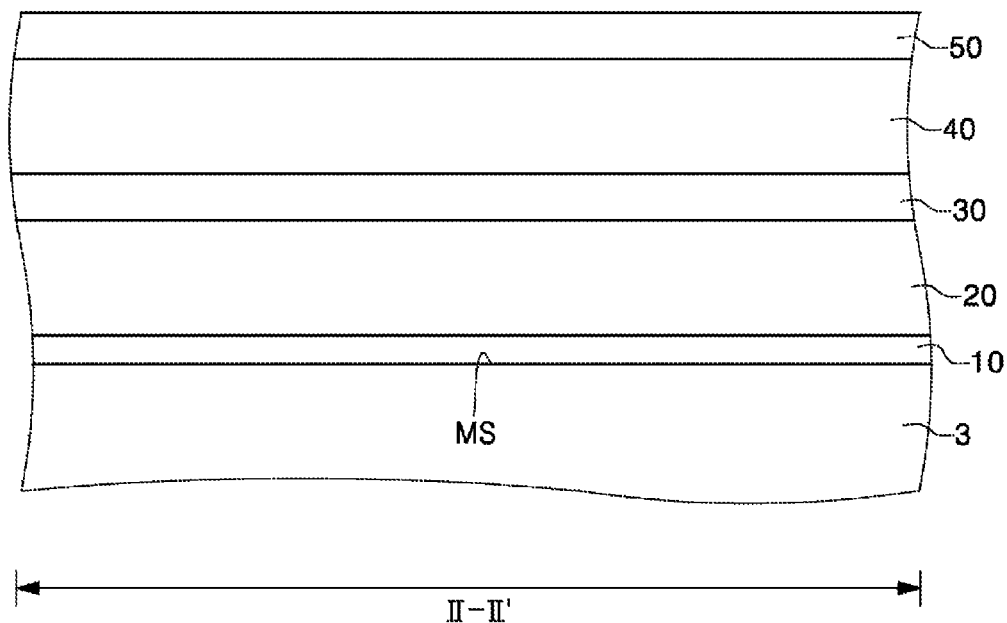

Referring to FIGS. 4A and 4B, a semiconductor substrate 3 is prepared. The semiconductor substrate 3 may include single crystalline silicon or the like, and may be conductive. A first insulating layer 10 is formed on the semiconductor substrate 3. The first insulating layer 10 contacts a main surface MS of the semiconductor substrate 3. The first insulating layer 10 may be a single film or a multi-layer film.

In one example, the first insulating layer 10 may be a silicon oxynitride (SiON) film. Alternatively, the first insulating layer 10 may include at least two of a silicon oxide ($SiO_2$) film, a silicon nitride film, and a silicon oxynitride film. In a more specific example, the first insulating layer 10 may be a silicon oxide film/a silicon oxynitride film ($SiO_2$/SiON), a silicon oxynitride film/a silicon oxide film (SiON/$SiO_2$), a silicon nitride film/a silicon oxide film ($Si_3N_4$/$SiO_2$), or a silicon nitride film/a silicon oxynitride film ($Si_3N_4$/SiON). The first insulating layer 10 may include a silicon oxide film/a silicon oxynitride film/a silicon oxide film ($SiO_2$/SiON/$SiO_2$), a silicon oxide film/a silicon nitride film/a silicon oxynitride film ($SiO_2$/$Si_3N_4$/SiON), or a silicon oxide film/a silicon nitride film /a silicon oxide film ($SiO_2$/$Si_3N_4$/$SiO_2$). The first insulating layer 10 may include a silicon oxide film/a silicon nitride film/a silicon oxynitride film/a silicon oxide film ($SiO_2$/$Si_3N_4$/SiON/$SiO_2$) or a silicon oxide film/a silicon oxynitride film/a silicon nitride film/a silicon oxide film ($SiO_2$/SiON/$Si_3N_4$/$SiO_2$). The silicon oxynitride film may have a thickness of about 100 Å or more.

In at least one example embodiment, the silicon oxynitride film may include nitrogen atoms at greater than or equal to about 13 atomic weight percent (at %). In this case, the silicon oxynitride film may be formed to a thickness of less than about 100 Å. In another example, when the silicon oxynitride film includes nitrogen atoms at about 21 at %, the silicon oxynitride film may be formed to a thickness of several Å (e.g., about 7 Å).

When the first insulating layer 10 includes a silicon nitride film and a silicon oxide film, the silicon nitride film may have a thickness of greater than or equal to about 20 Å.

The first insulating layer 10 may be formed using an atomic layer deposition (ALD) or similar technique.

Referring still to FIGS. 4A and 4B, a first sacrificial layer 20 is formed on the first insulating layer 10. The first sacrificial layer 20 may include silicon nitride ($Si_3N_4$) or the like.

A second insulating layer 30 is formed on the first sacrificial layer 20. The second insulating layer 30 may include a single silicon oxide layer or a multi-layer silicon oxide layer.

A second sacrificial layer 40 is formed on the second insulating layer 30. The second sacrificial layer 40 may include the same or substantially the same material as the first sacrificial layer 20.

A third insulating layer 50 is formed on the sacrificial layer 40. The third insulating layer 50 may include the same or substantially the same material as the second insulating layer 30. In this example, the second sacrificial layer 40 and the third insulating layer 50, which may make up a pair, may be periodically and repetitively formed on the second insulating layer 30 in a number equal to the number of the third insulating patterns 55 of FIG. 3.

Figure 5A:
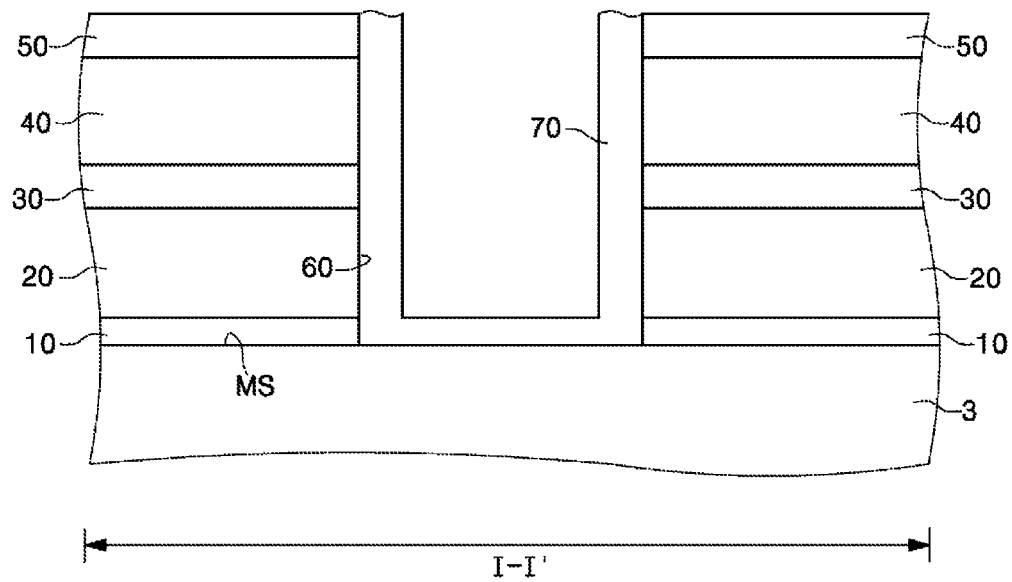
Figure 5B:
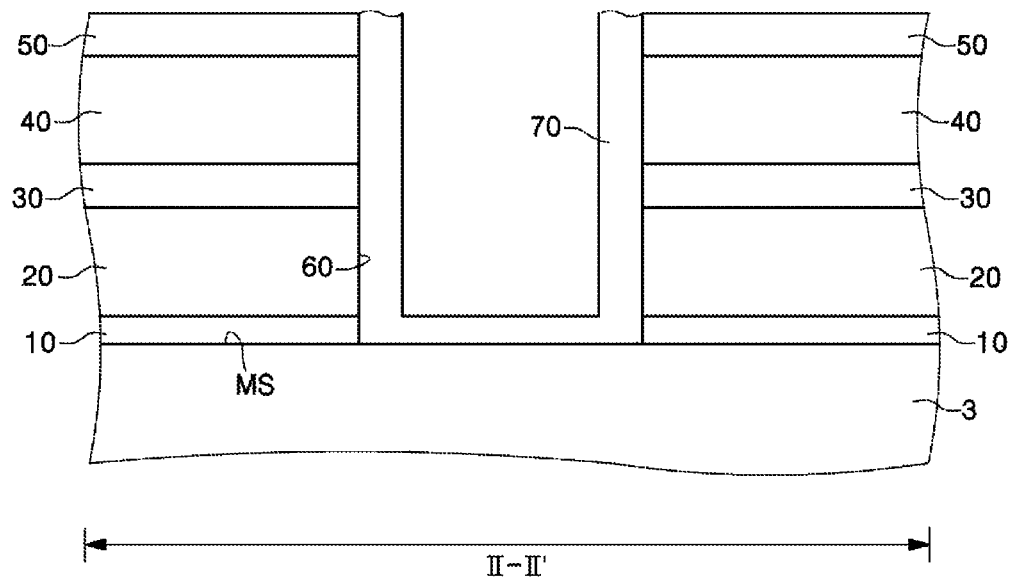

Referring to FIGS. 5A and 5B, a channel hole 60 is formed to vertically penetrate the first through third insulating layers 10, 30, and 50 and the first and second sacrificial layers 20 and 40. In this example, the channel hole 60 is disposed on a given, desired or predetermined region of the third insulating layer 50 and penetrates the first through third insulating layers 10, 30, and 50 and the first and second sacrificial layers 20 and 40. The channel hole 60 exposes a portion of the main surface MS of the semiconductor substrate 3 and sidewalls of the first through third insulating layers 10, 30, and 50 and the first and second sacrificial layers 20 and 40.

A data storage layer 70 is formed on a sidewall of the channel hole 60 and the exposed portion of the main surface MS. As shown in FIGS. 5A and 5B, the data storage layer 70 conformally covers the sidewall of the channel hole 60 and the exposed portion of the main surface MS of the semiconductor substrate 3. The data storage layer 70 may include, for example, a first silicon oxide layer, a silicon nitride layer, and a second silicon oxide layer. The silicon nitride layer of the data storage layer 70 may include charge trapping sites.

As described in FIGS. 4A and 4B, in alternative example embodiments, when the second sacrificial layer 40 and the third insulating layer 50 are periodically and repetitively formed on the second insulating layer 30, the channel hole 60 may extend from the main surface MS of the semiconductor substrate 3 to the second sacrificial layer 40 and the third insulating layer 50 corresponding to the uppermost layers. Furthermore, the data storage layer 70 may extend along the channel hole 60 from the main surface MS of the semiconductor substrate 3 to a top surface of the third insulating layer 50 corresponding to the uppermost layer.

Figure 6A:
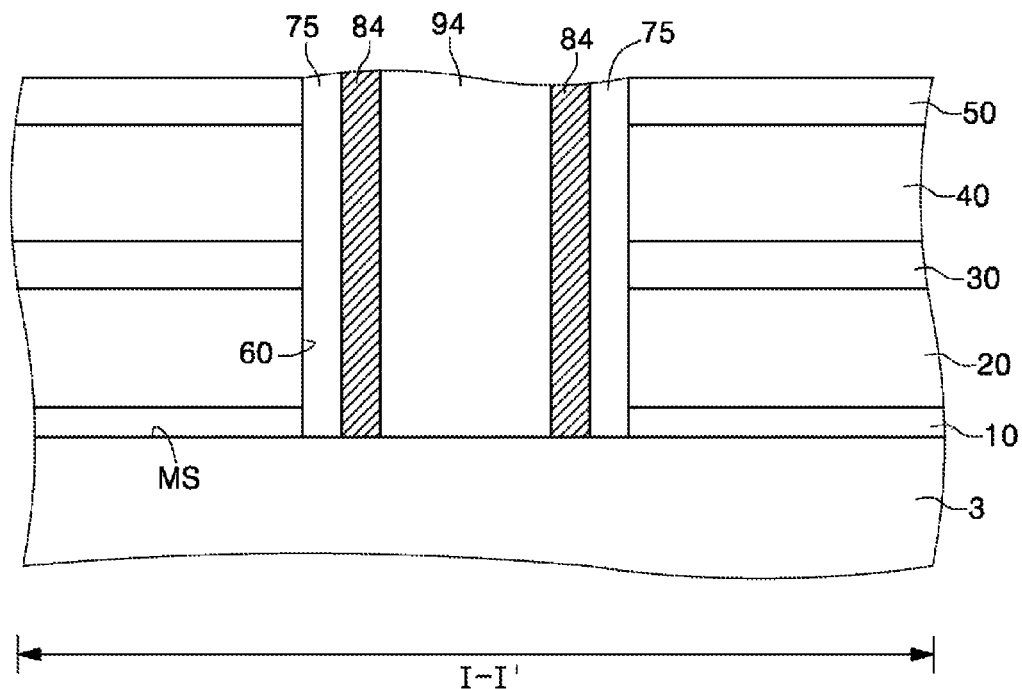
Figure 6B:
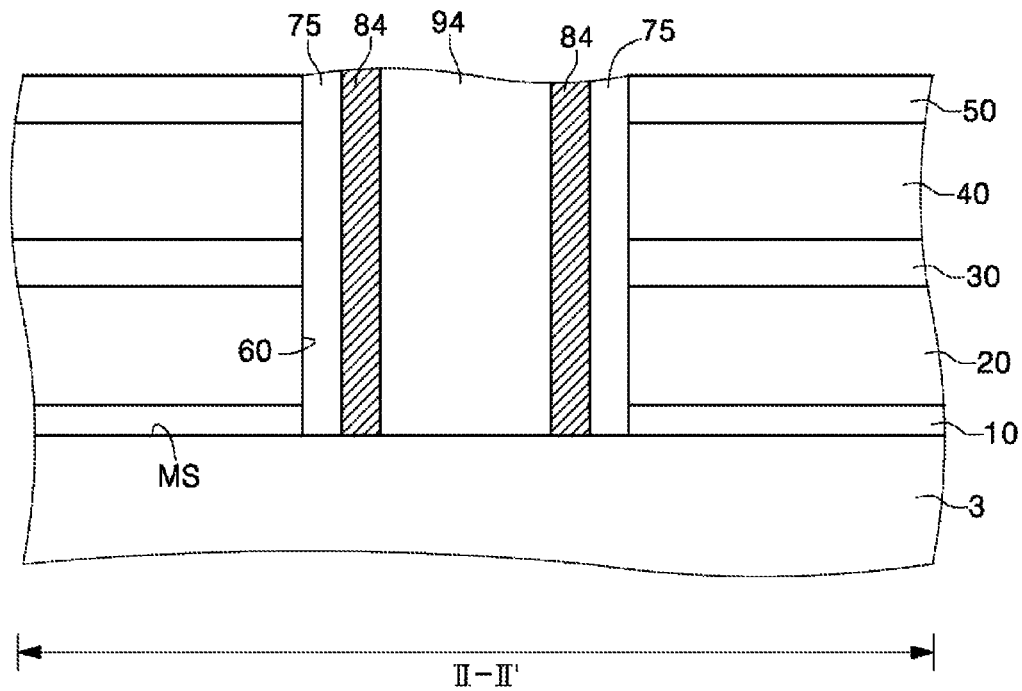

Referring to FIGS. 6A and 6B, the data storage layer 70 is patterned until the semiconductor substrate 3 disposed within the channel hole 60 is exposed, thereby forming a data storage pattern 75. The data storage pattern 75 covers the sidewall of the channel hole 60 and exposes a portion of the main surface MS of the semiconductor substrate 3.

A vertical channel layer (not shown) is formed on the semiconductor substrate 3 and the data storage pattern 75. The vertical channel layer may include undoped poly-Si. The vertical channel layer conformally covers the semiconductor substrate 3 and the data storage pattern 75. The vertical channel layer is patterned until the semiconductor substrate 3 disposed within the channel hole 60 is exposed, thereby forming a vertical channel pattern 84. The vertical channel pattern 84 covers the data storage pattern 75 and exposes a portion of the main surface MS of the semiconductor substrate 3.

A filling pattern 94 is formed to sufficiently fill the channel hole 60. The filling pattern 94 may include an insulating material containing silicon oxide or the like. As described in FIGS. 5A and 5B, according to an alternative example embodiment, when the second sacrificial layer 40 and the third insulating layer 50 are periodically and repetitively formed on the second insulating layer 30, the data storage pattern 75, the vertical channel pattern 84, and the filling pattern 94 may extend from the main surface MS of the semiconductor substrate 3 along the channel hole 60 and be formed on sidewalls of the third insulating layer 50 corresponding to the uppermost layer.

Figure 7A:
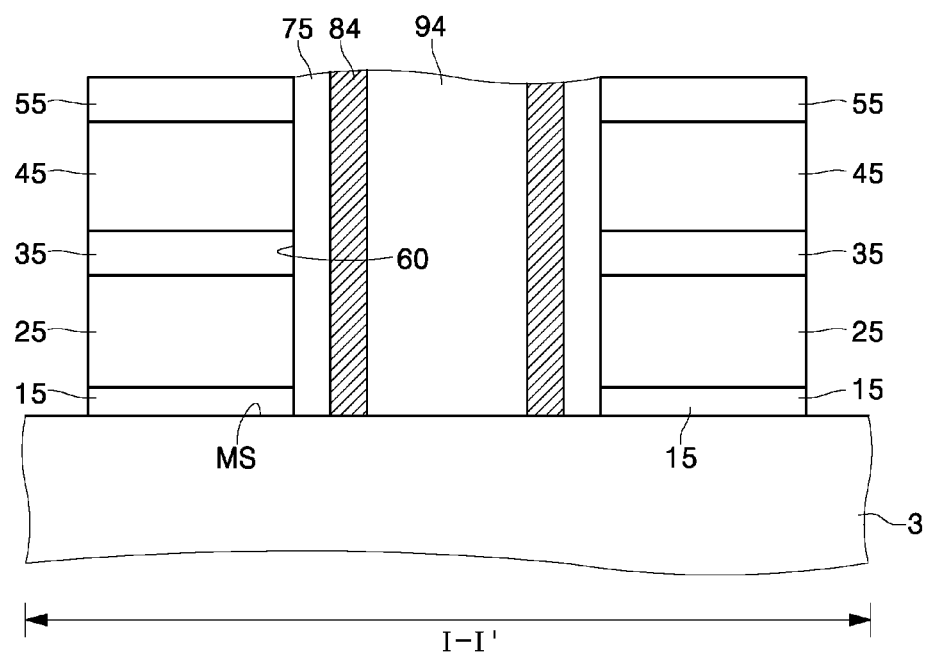
Figure 7B:
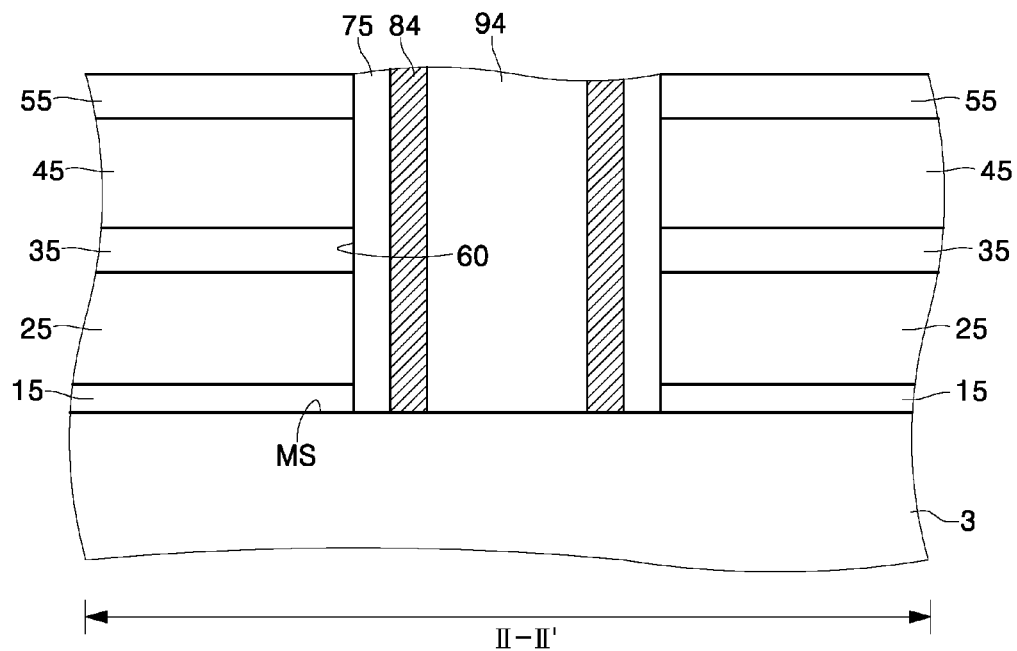

Referring to FIGS. 7A and 7B, the first through third insulating layers 10, 30, and 50 and the first and second sacrificial layers 20 and 40 are patterned to expose the semiconductor substrate 3. Thus, first through third insulating patterns 15, 35, and 55 and first and second sacrificial patterns 25 and 45 are formed on the semiconductor substrate 3. The first through third insulating patterns 15, 35, and 55 and the first and second sacrificial patterns 25 and 45 have the same or substantially the same shape as the first gate line 1 GL of FIG. 1.

In this example, the first through third insulating patterns 15, 35, and 55 and the first and second sacrificial patterns 25 and 45 expose the main surface MS of the semiconductor substrate along line I-I' of FIG. 1 as shown in FIG. 7A. The first through third insulating patterns 15, 35, and 55 and the first and second sacrificial patterns 25 and 45 cover the semiconductor substrate 3 along line II-II' of FIG. 1 as shown in FIG. 7B.

The first through third insulating patterns 15, 35, and 55 and the first and second sacrificial patterns 25 and 45 are formed to surround the channel hole 60.

As described in FIGS. 6A and 6B, according to an alternative example embodiment, when the second sacrificial layer 40 and the third insulating layer 50 are periodically and repetitively formed on the second insulating layer 30, the second sacrificial pattern 45 and the third insulating pattern 55 may be periodically and repetitively formed on the second insulating pattern 35.

Figure 8A:
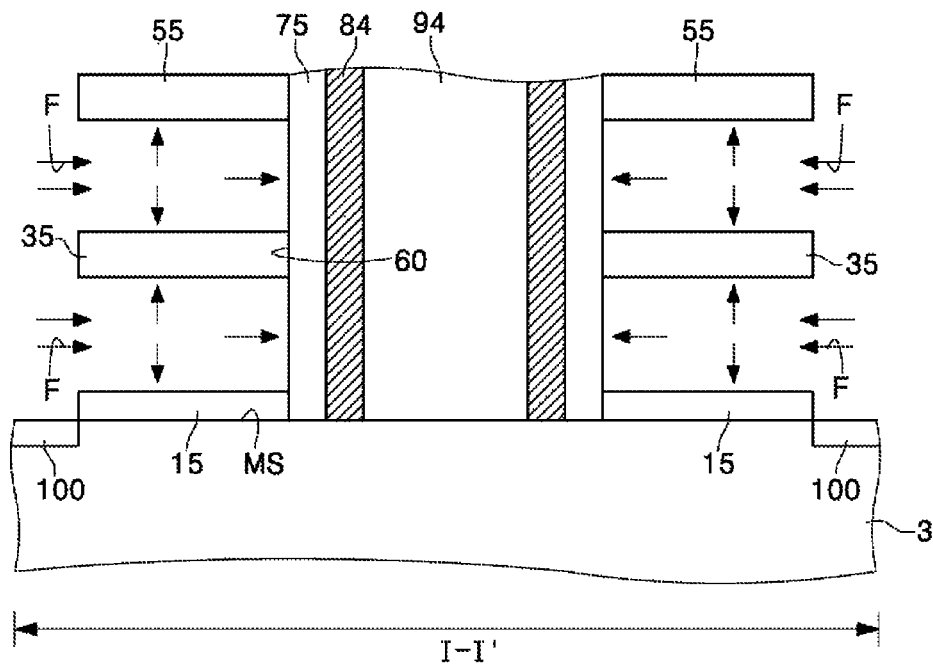
Figure 8B:
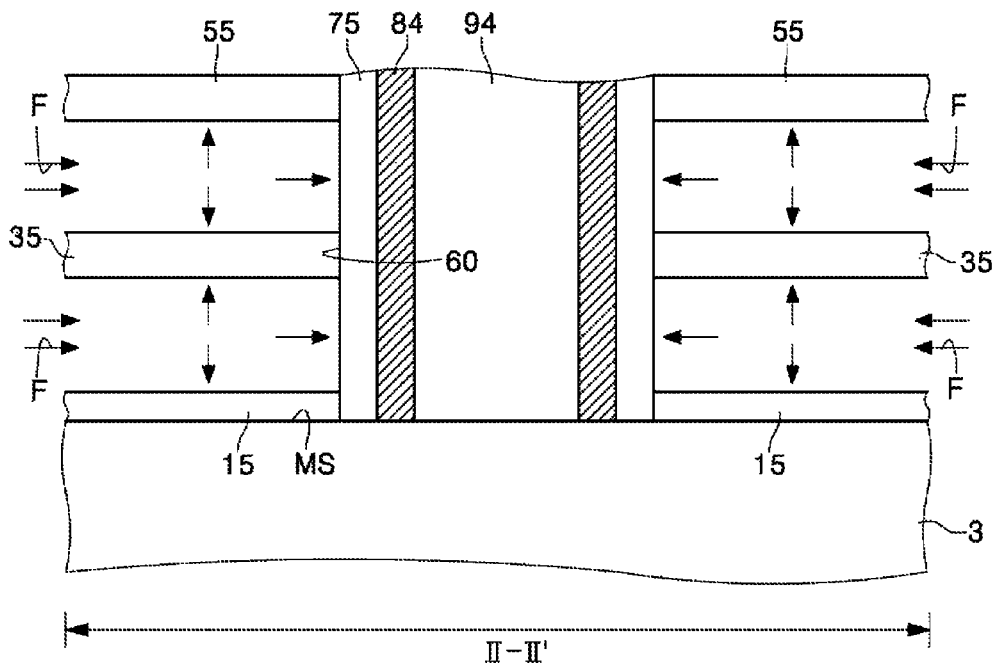

Referring to FIGS. 8A and 8B, the first and second sacrificial patterns 25 and 45 are removed. The first and second sacrificial patterns 25 and 45 may be removed using, for example, a phosphoric acid solution. In this example, the first through third insulating patterns 15, 35, and 55 may have a tolerance to the phosphoric acid solution. In other words, for example, the phosphoric acid solution may have a higher etch rate with respect to the first and second sacrificial patterns 25 and 45 than with respect to the first through third insulating patterns 15, 35, and 55.

Figure 17:
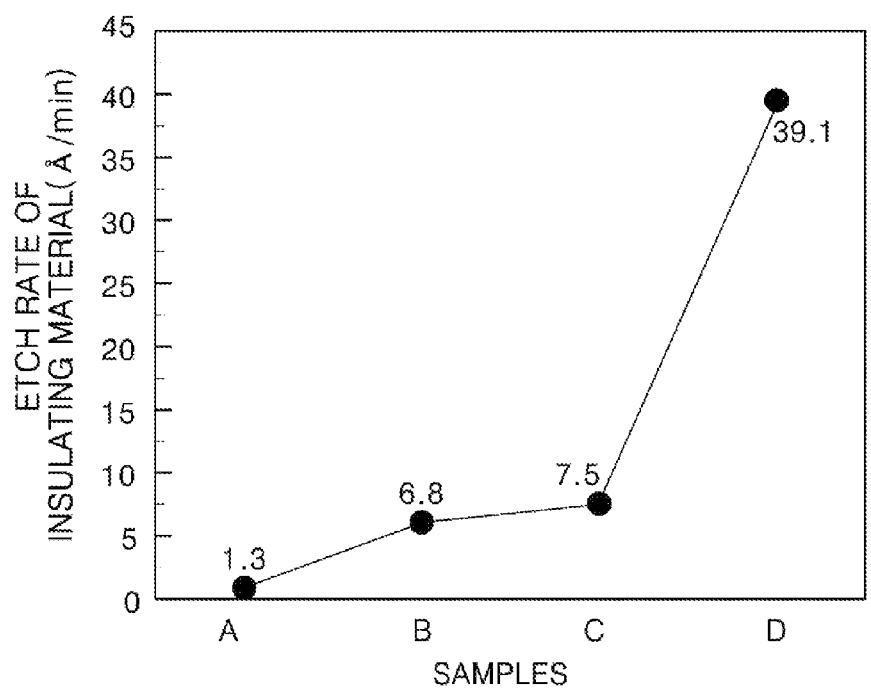
FIG. 17 is a graph showing an etch rate of an insulating material with respect to a phosphoric acid solution during formation of a cell string according to an example embodiment.

Etch rates of the phosphoric acid solution are shown in FIG. 17. According to the experimental results shown in FIG. 17, the first through third insulating patterns 15, 35, and 55 may be used as an etch buffer layer or etch mask during removal of the first and second sacrificial patterns 25 and 45 using the phosphoric acid solution.

When the first insulating pattern 15 includes a silicon nitride film, the silicon nitride film may be formed under a silicon oxide film and/or a silicon oxynitride film or between a silicon oxide film and/or a silicon oxynitride film and protected from an etching process using the phosphoric acid solution. The first and second sacrificial patterns 25 and 45 may be completely removed using the phosphoric acid solution.

As shown in FIGS. 8A and 8B, the data storage pattern 75 is exposed in regions from which the first and second sacrificial patterns 25 and 45 are removed.

Referring still to FIGS. 8A and 8B, a wet oxidation process is performed on the exposed surfaces of the semiconductor substrate 3, the first through third insulating patterns 15, 35, and 55, and the data storage pattern 75. The wet oxidation process may be performed in a reaction chamber in oxygen ($O_2$) and hydrogen ($H_2$) vapor atmospheres at a temperature of about 850° C. for about 30 minutes.

Oxidants of the wet oxidation process may contact the semiconductor substrate 3, the first through third insulating patterns 15, 35, and 55, and the data storage pattern 75. The wet oxidation process may be performed at different oxidation rates with respect to the semiconductor substrate 3, the first through third insulating patterns 15, 35, and 55, and the data storage pattern 75.

Figure 18:
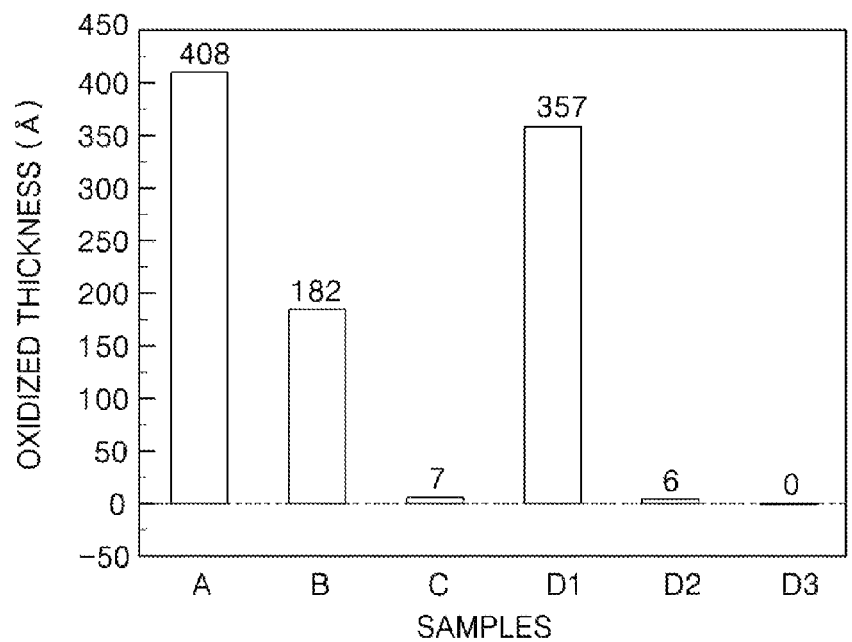
FIG. 18 is a graph showing an oxidation rate of a semiconductor substrate disposed under an insulating material in an atmosphere of a wet oxidation process during formation of a cell string according to an example embodiment.

Example oxidation rates of a wet oxidation process are shown in FIG. 18. Referring to FIG. 18, an oxidation reaction of the semiconductor substrate 3 with the oxidants is controlled according to a material of the first insulating pattern 15. Specifically, when the first insulating pattern 15 includes a silicon oxynitride film containing nitrogen atoms at less than or equal to about 13 at % and the silicon oxynitride film has a thickness of less than or equal to about 100 Å, it may be relatively difficult to control the thickness of a reactant generated by the wet oxidation process to be less than or equal to about 182 Å.

When the first insulating pattern 15 includes a silicon oxynitride film containing nitrogen atoms at greater than or equal to about 13 at % and the silicon oxynitride film has a thickness of greater than or equal to about 100 Å, the thickness of a reactant generated by the wet oxidation process may be more easily controlled to be less than or equal to about 182 Å. Also, it may be seen that when the first insulating pattern 15 includes a 100 Å-thick silicon oxynitride film containing nitrogen atoms at about 21 at %, the thickness of a reactant generated by the wet oxidation process is about 7 Å.

From the experimental results shown in FIGS. 17 and 18, when the first insulating pattern 15 includes a silicon oxynitride film containing nitrogen atoms at greater than or equal to about 21 at % and the silicon oxynitride film has a thickness of greater than or equal to about 100 Å, the thickness of a reactant generated by the wet oxidation process may be negligible. Accordingly, when the first insulating pattern 15 includes a silicon oxynitride film containing more nitrogen atoms, the first insulating pattern 15 has a relatively good tolerance to the wet oxidation process.

However, another question may be raised when the silicon oxynitride film contains many (e.g., excessive) nitrogen atoms because the silicon oxynitride film included in the first insulating pattern 15 should not be removed during an etching process using a phosphoric acid solution before the wet oxidation process. For example, as the first insulating pattern 15 contains more nitrogen atoms, the etching tolerance of the first insulating pattern 15 to the phosphoric acid solution may decrease. Thus, the silicon oxynitride film may require protection from the phosphoric-acid-solution.

Furthermore, when the first insulating pattern 15 includes silicon nitride film that is about 20 Å thick, a reactant generated by the wet oxidation process has a thickness of about 6 Å. From the experimental results, it may be concluded that when the first insulating pattern 15 includes a silicon nitride film protected from an etching process using a phosphoric acid solution and the silicon nitride film has a thickness of greater than or equal to about 20 Å, the thickness of a reactant generated by the wet oxidation process may be reduced (e.g., greatly reduced).

For example, it may be assumed that the first insulating pattern 15 is formed of a triple film including a silicon oxide film/a silicon nitride film/a silicon oxide film. Also, the second insulating pattern 35 may include oxygen (O) and silicon (Si), which are relatively stably and chemically bonded in a silicon oxide.

Silicon oxide is exposed on the surfaces of the third insulating pattern 55 and the data storage pattern 75 in spaces from which the first and second sacrificial patterns 25 and 45 are removed.

Like the second insulating pattern 35, the silicon oxide of the third insulating pattern 55 and the data storage pattern 75 include oxygen (O) and silicon (Si), which are relatively stably and chemically bonded with each other. It may be relatively difficult to allow silicon oxide of the second and third insulating patterns 35 and 55 and the data storage pattern 75 to react with oxidants of the wet oxidation process. The wet oxidation process may harden the data storage pattern 75 and reduce an etching damage caused by a phosphoric acid solution with respect to the data storage pattern 75.

In contrast, the oxidants of the wet oxidation process may react with the semiconductor substrate 3 more easily to form an oxide layer 100. As shown in FIG. 8A, the oxide layer 100 is formed apart from the data storage pattern 75 and the vertical channel pattern 84 in the vicinity of the first insulating pattern 15.

Figure 9A:
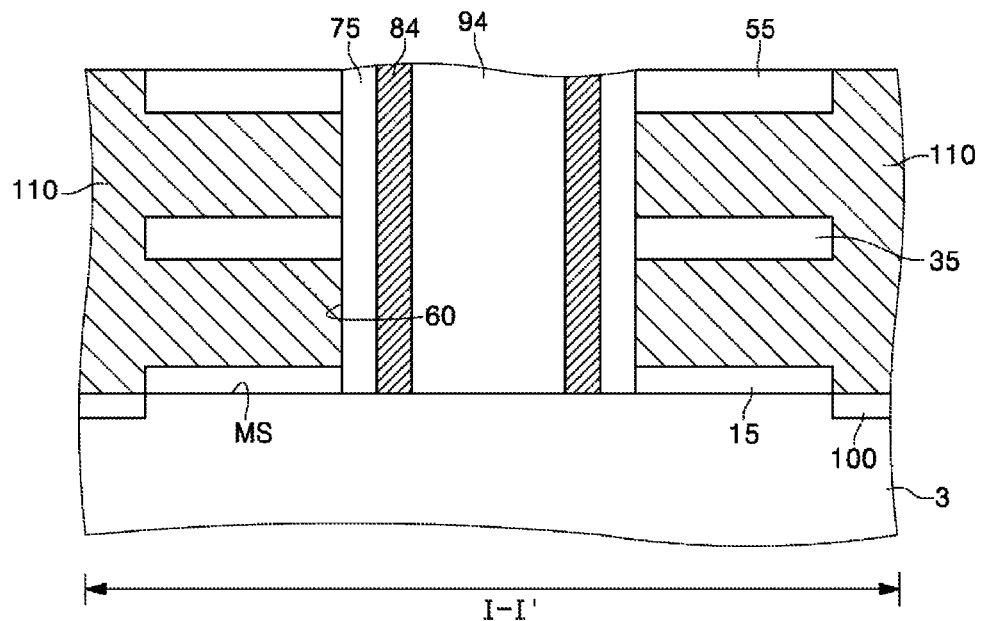
Figure 9B:
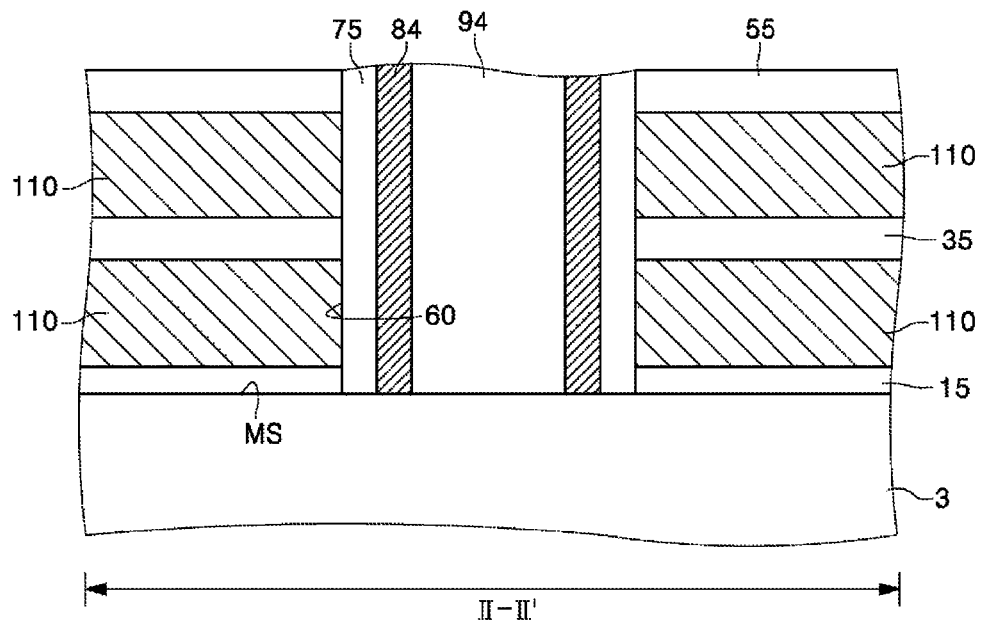

Referring to FIGS. 9A and 9B, a conductive layer 110 is formed. In this example embodiment, the conductive layer 110 covers the semiconductor substrate 3 and the first through third insulating patterns 15, 35, and 55. The conductive layer 110 covers the oxide layer 100 of the semiconductor substrate 3. In this example, the conductive layer 110 fills vacant spaces between the first through third insulating patterns 15, 35, and 55.

The conductive layer 110 contacts the data storage pattern 75 through the vacant spaces. The conductive layer 110 may include a single conductive material layer or a multi-layer conductive material layer. The conductive layer 110 may include a metal or doped poly-Si. Meanwhile, as described with regard to FIGS. 8A and 8B, when a plurality of third insulating patterns 55 are formed on the second insulating pattern 35, the conductive layer 110 may fill the vacant spaces along the data storage pattern 75, extend from the main surface MS of the semiconductor substrate 3, and be disposed on the third insulating pattern 55 corresponding to the uppermost portion.

Figure 10A:
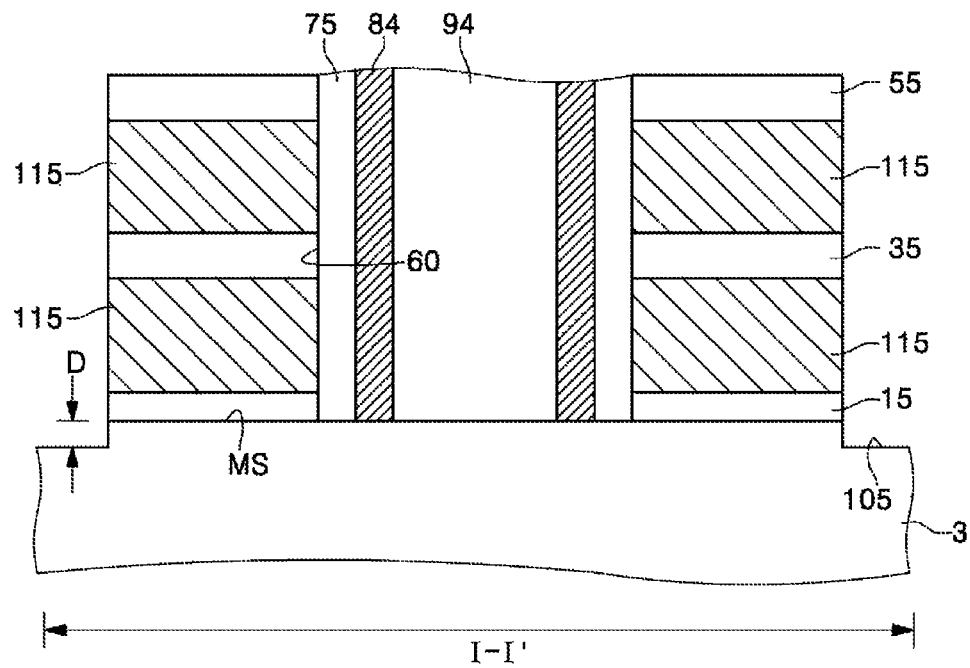
Figure 10B:
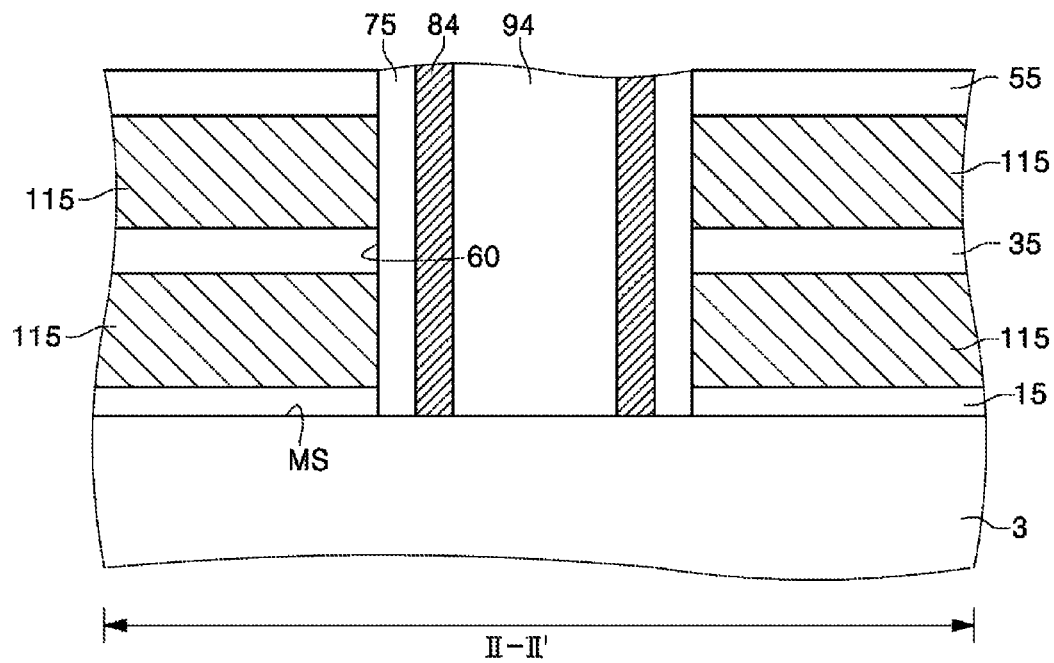

Referring to FIGS. 10A and 10B, the conductive layer 110 is etched using the first through third insulating patterns 15, 35, and 55 as an etch mask or etch buffer layer. Conductive patterns 115 are formed between the first through third insulating patterns 15, 35, and 55. In at least this example embodiment, the conductive patterns 115 expose the semiconductor substrate 3 and the oxide layer 100 along with the first through third insulating patterns 15, 35, and 55.

Each of the conductive patterns 115 corresponds to a first gate line 1GL as described above with regard to FIGS. 1 and 2. The conductive patterns 115 form a portion of the first gate line group 1GL's described above with regard to FIGS. 1 and 2. Subsequently, the oxide layer 100 is removed from the semiconductor substrate 3 using the first through third insulating patterns 15, 35, and 55 and the conductive patterns 115 as an etch mask or etch buffer layer.

After the removal of the oxide layer 100, the semiconductor substrate 3 includes concave portions 105 formed in the vicinity of the first through third insulating patterns 15, 35, and 55 and the conductive patterns 115 as shown in FIG. 10A. The concave portions 105 may have a step difference with respect to the main surface MS of the semiconductor substrate 3. More specifically, for example, the concave portions 105 may be formed to a given, desired or predetermined depth D from the main surface of the semiconductor substrate 3.

The concave portions 105 may be recessed inward from the main surface MS of the semiconductor substrate 3 to the interior thereof. The concave portions 105 may or may not meet each other in the vicinity of the first insulating pattern 15. Sidewalls of the concave portions 105 may be aligned with sidewalls of the first insulating patterns 15.

As described with regard to FIGS. 9A and 9B, when a plurality of third insulating patterns 55 are formed on the second insulating pattern 35, the number of the conductive patterns 115 may be equal to the number of spaces formed among the first through third insulating patterns 15, 35, and 55 and between the third insulating patterns 55. Accordingly, the conductive patterns 115 constitute a cell string CSTR0 discussed with regard to FIG. 3 along with the semiconductor substrate 3 and the first through third insulating patterns 15, 35, and 55.

FIGS. 11A through 16B are cross-sectional views illustrating a method of forming a cell string according to another example embodiment. The cross-sectional views shown in FIGS. 11A through 16B are taken along lines I-I' and II-II' of FIG. 1 to correspond to P2 in FIG. 3. In FIGS. 11A through 16B, the same reference numerals are used to denote the same components as in FIGS. 4A through 10B.

Figure 11A:
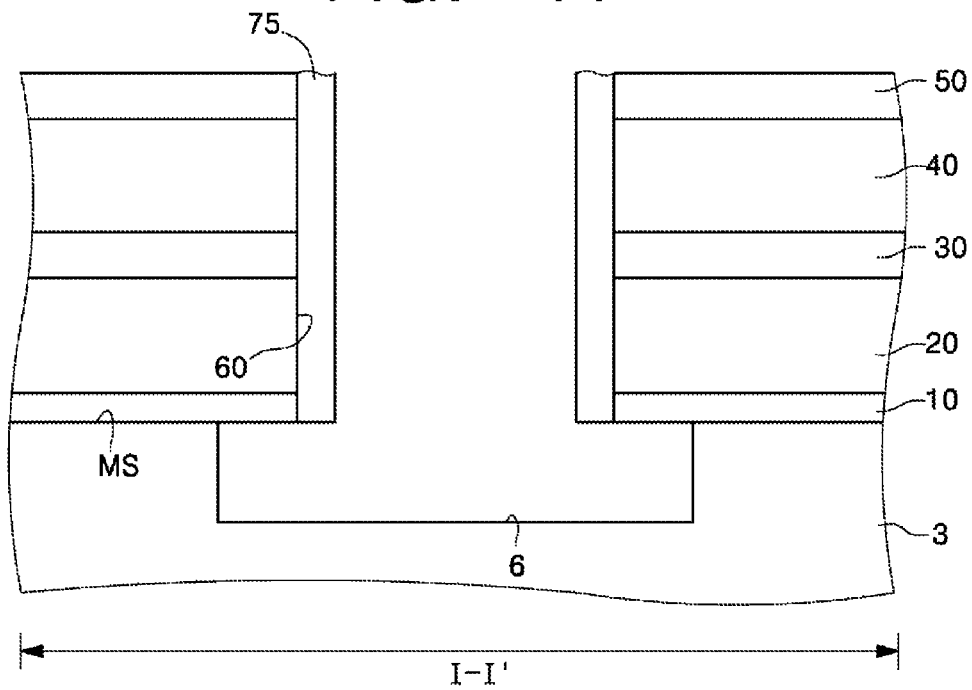
FIGS. 11A through 16B are cross-sectional views illustrating a method of forming a cell string according to an example embodiment taken along lines I-I' and II-II' of FIG. 1 to correspond to P2 of FIG. 3.
Figure 11B:
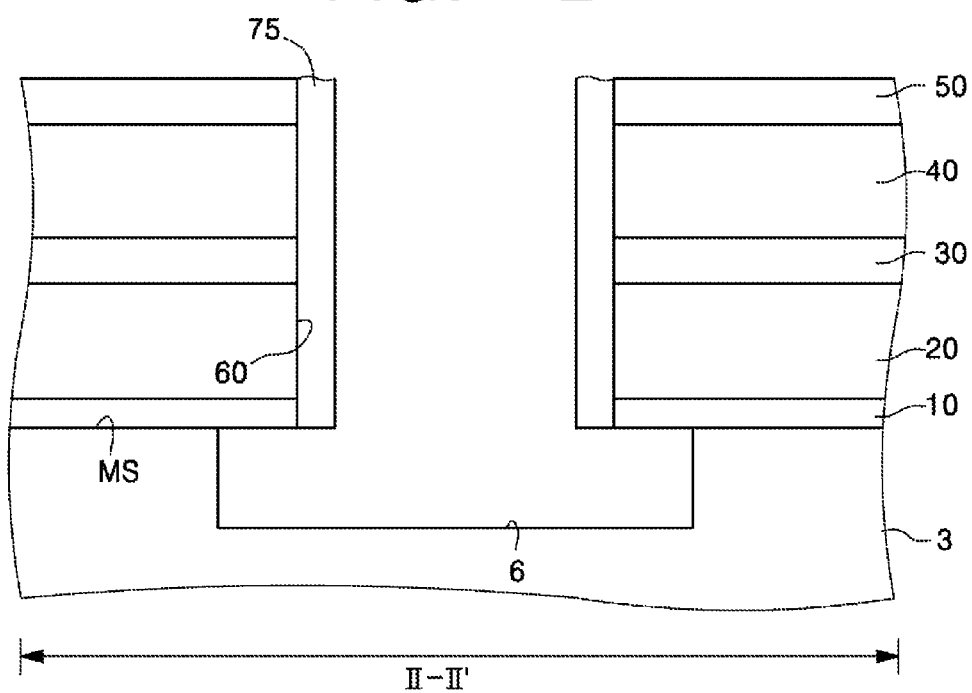

Referring to FIGS. 11A and 11B, a semiconductor substrate 3 disposed in a channel hole 60 is isotropically etched using the data storage pattern 75 and the first insulating layer 10 of FIGS. 6A and 6B as an etch mask and an etch buffer layer, respectively. Alternatively, the semiconductor substrate 3 disposed in the channel hole 60 may be sequentially etched using anisotropic and isotropic etching processes. The semiconductor substrate 3 includes a recessed portion 6.

The recessed portion 6 is recessed from a main surface MS of the semiconductor substrate 3 to the interior thereof, and extends under the first insulating layer 10 in a horizontal direction. Thus, the recessed portion 6 exposes a bottom surface of the first insulating layer 10 in the vicinity of the data storage pattern 75.

In this example embodiment, the recessed portion 6 is defined by the semiconductor substrate 3. The channel hole 60 is defined by first through third insulating layers 10, 30, and 50 and first and second sacrificial layers 20 and 40.

Figure 12A:
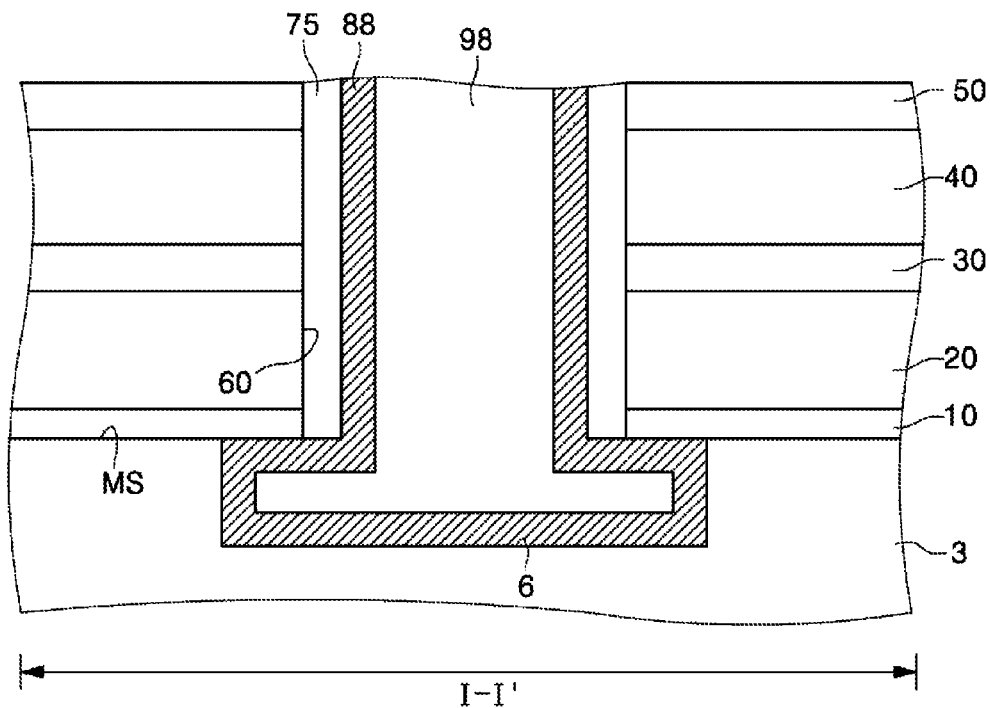
Figure 12B:
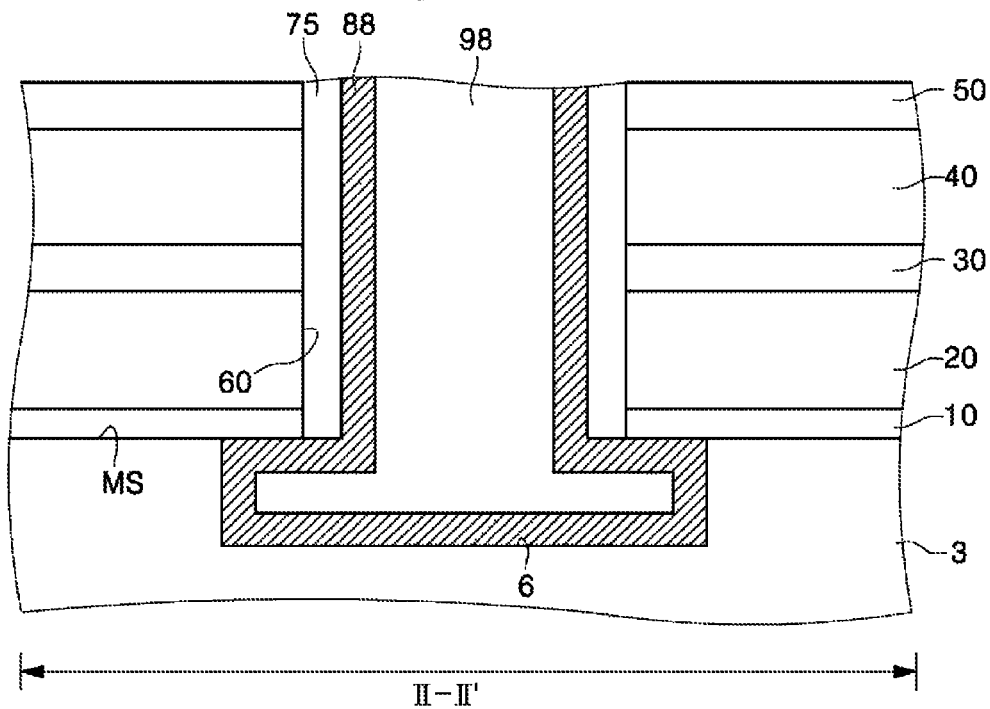

Referring to FIGS. 12A and 12B, a vertical channel pattern 88 is formed in the recessed portion 6 and the channel hole 60. The vertical channel pattern 88 conformally covers the recessed portion 6 and the data storage pattern 75. The vertical channel pattern 88 contacts a bottom end of the data storage pattern 75 in the recessed portion 6. The vertical channel pattern 88 may include the same or substantially the same material as the vertical channel pattern 84 of FIG. 6A.

A filling pattern 98 is formed in the recessed portion 6 and the channel hole 60. The filling pattern 98 fills the recessed portion 6 and the channel hole 60 to cover the vertical channel pattern 88.

In alternative example embodiments, as described in FIGS. 4A and 4B, when the second sacrificial layer 40 and the third insulating layer 50 are periodically and repetitively formed on the second insulating layer 30, the data storage pattern 75, the vertical channel pattern 88, and the filling pattern 98 may extend to the third insulating layer 50 corresponding to the uppermost layer.

Figure 13A:
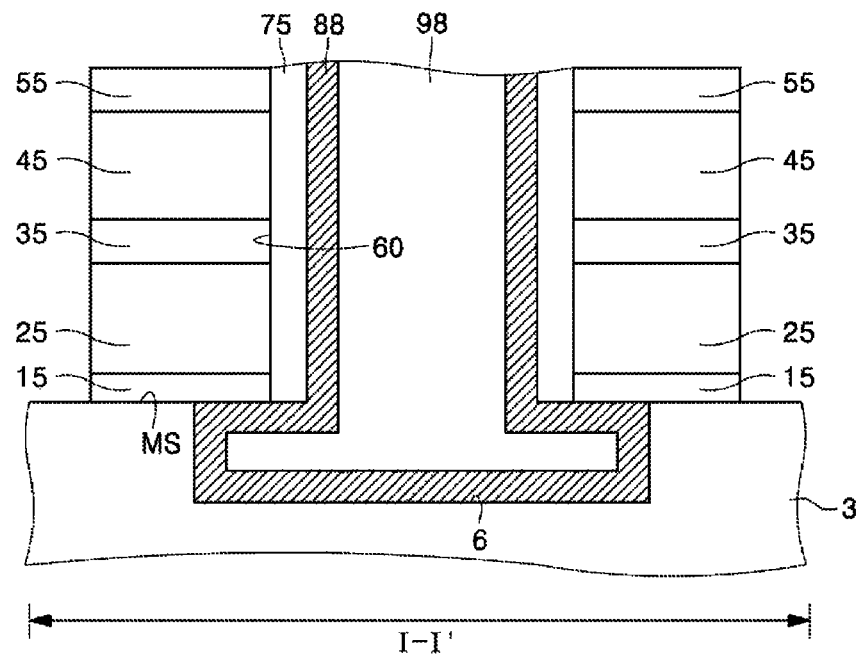
Figure 13B:
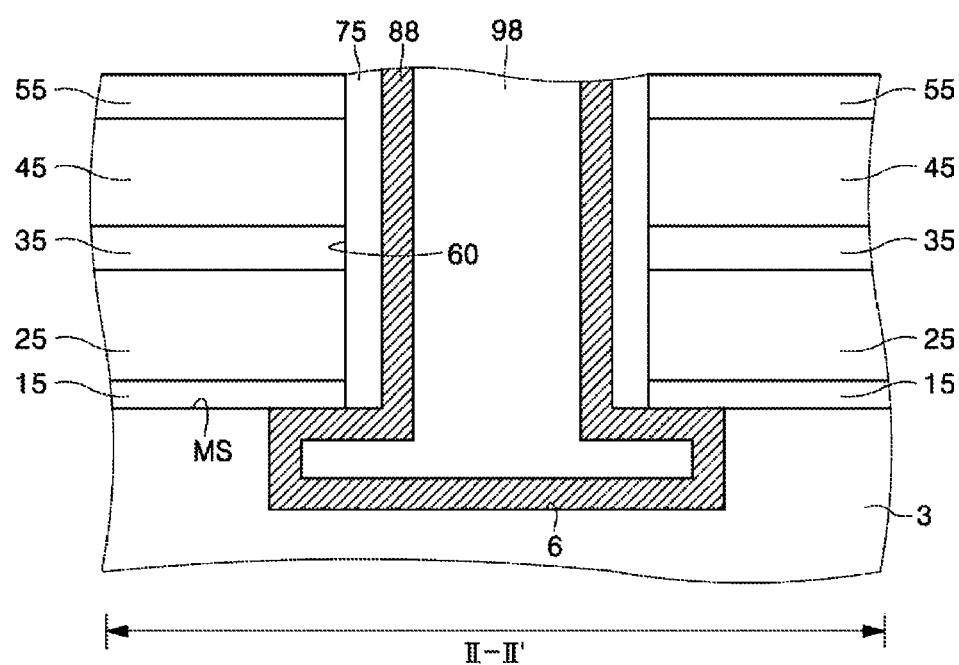

Referring to FIGS. 13A and 13B, the first through third insulating layers 10, 30, and 50 and the first and second sacrificial layers 20 and 40 are patterned to form first through third insulating patterns 15, 35, and 55 and first and second sacrificial patterns 25 and 45. The first through third insulating patterns 15, 35, and 55 and the first and second sacrificial patterns 25 and 45 expose portions of the main surface MS of the semiconductor substrate 3.

Meanwhile, in alternative example embodiments as described in FIGS. 12A and 12B, when the second sacrificial layer 40 and the third insulating layer 50 are periodically and repetitively formed on the second insulating layer 30, the second sacrificial pattern 45 and the third insulating pattern 55 may be periodically and repetitively formed on the second insulating pattern 35.

Figure 14A:
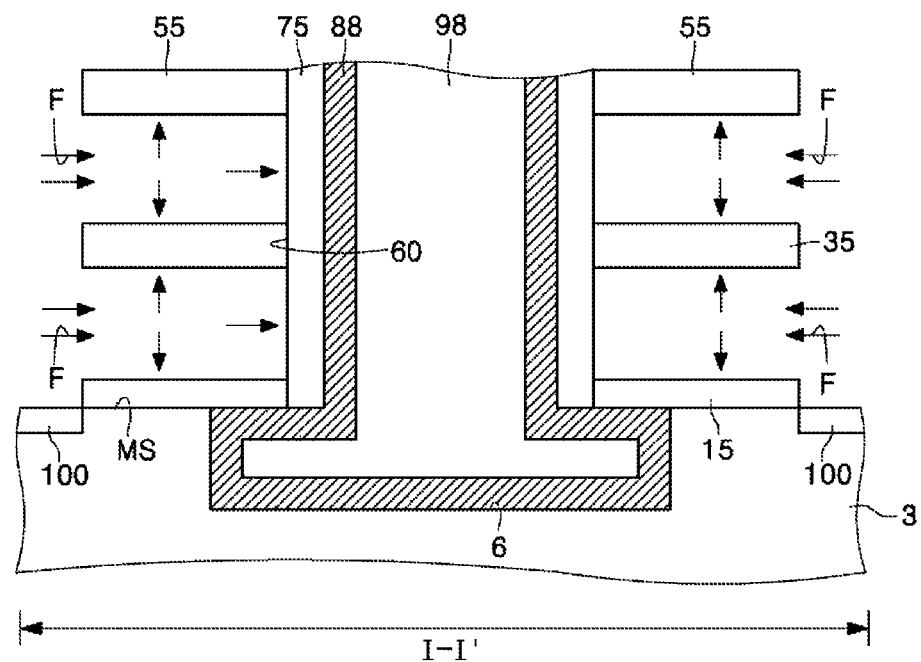
Figure 14B:
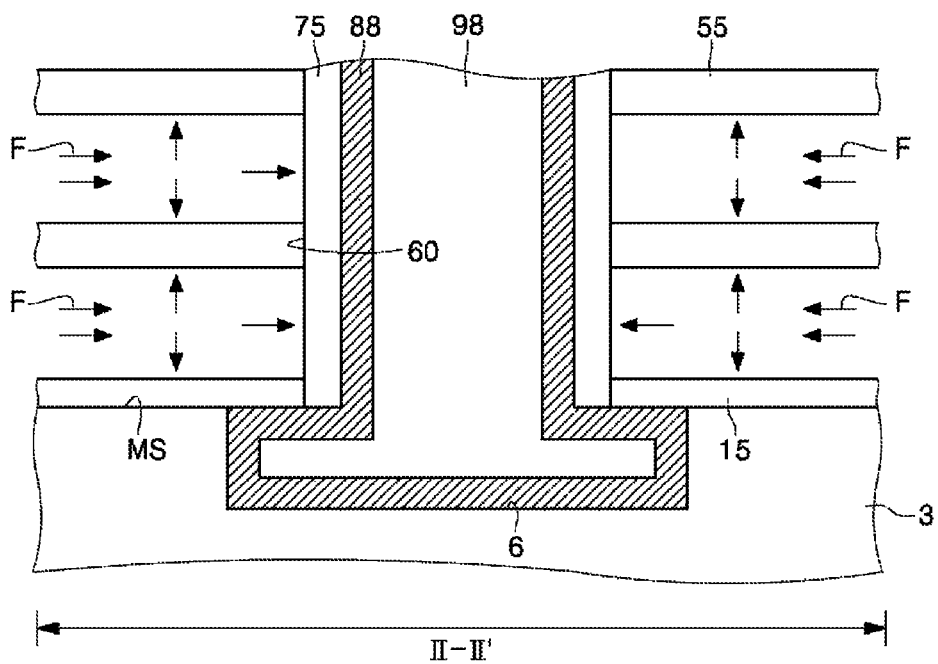

Referring to FIGS. 14A and 14B, the phosphoric acid solution of FIGS. 8A and 8B is applied to the first through third insulating patterns 15, 35, and 55 and the first and second sacrificial patterns 25 and 45. The first and second sacrificial patterns 25 and 45 are removed using the phosphoric acid solution to form spaces among the first through third insulating layers 15, 35, and 55. Subsequently, a wet oxidation process is performed on the semiconductor substrate 3, the first through third insulating patterns 15, 35, and 55 and the data storage pattern 75.

During the wet oxidation process, oxidants may be injected into the spaces between the first through third insulating layers 15, 35, and 55. The oxidants used during the wet oxidation process may contact the semiconductor substrate 3, the first through third insulating patterns 15, 35, and 55, and the data storage pattern 75 in an arrow direction F. The wet oxidation process may be performed under the same or substantially the same conditions as the wet oxidation process of FIGS. 8A and 8B.

An oxide layer 100 may be formed in portions of the semiconductor substrate 3 exposed by the wet oxidation process as shown in FIG. 14A. The oxide layer 100 may be formed in the vicinity of the first through third insulating patterns 15, 35, and 55.

Meanwhile, in alternative example embodiments, as described in FIGS. 13A and 13B, when the second sacrificial pattern 45 and the third insulating pattern 55 are periodically and repetitively formed on the second insulating pattern 35, the vacant spaces may be formed among the first through third insulating patterns 15, 35, and 55 and between the third insulating patterns 55 along the data storage pattern 75.

Figure 15A:
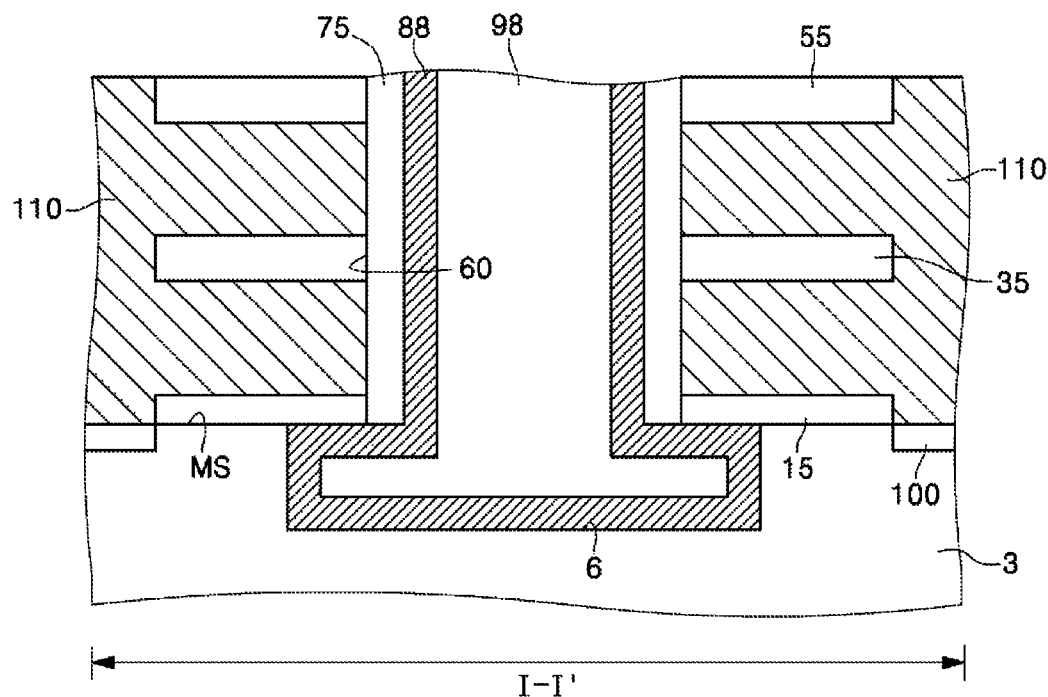
Figure 15B:
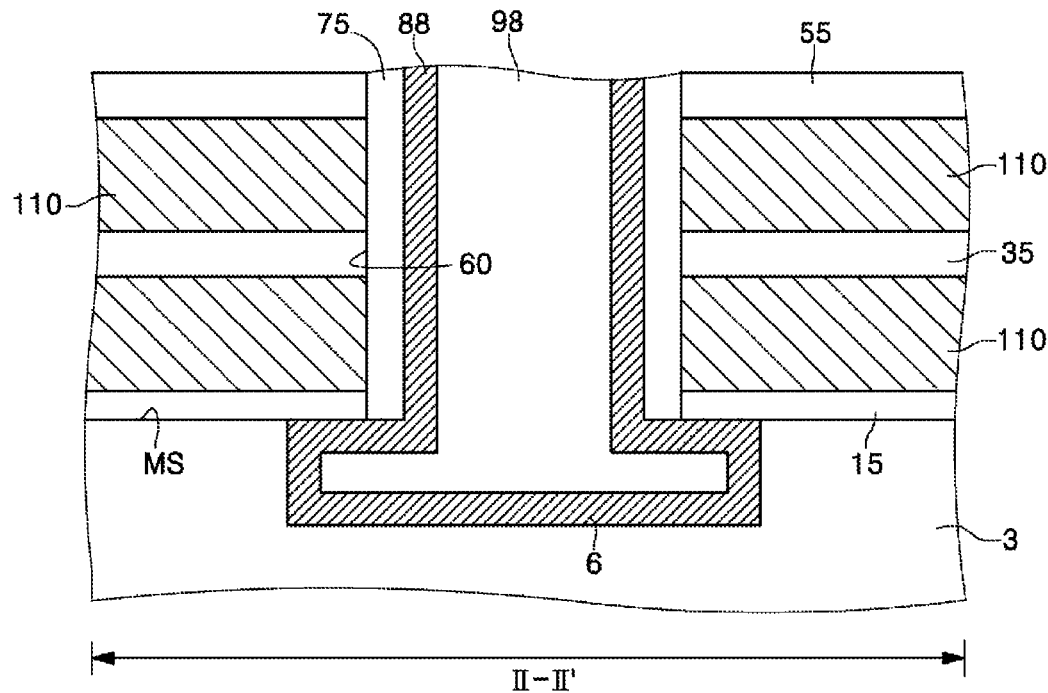

Referring to FIGS. 15A and 15B, a conductive layer 110 is formed on the semiconductor substrate 3. The conductive layer 110 covers the semiconductor substrate 3 and the oxide layer 100. The conductive layer 110 is also formed among the first through third insulating patterns 15, 35, and 55.

Meanwhile, in alternative example embodiments as described with regard to FIGS. 14A and 14B, when a plurality of third insulating patterns 55 are formed on the second insulating pattern 35, the conductive layer 110 may fill the vacant spaces along the data storage pattern 75 and extend from the main surface MS of the semiconductor substrate 3 to a top surface of the third insulating pattern 55 corresponding to the uppermost layer.

Figure 16A:
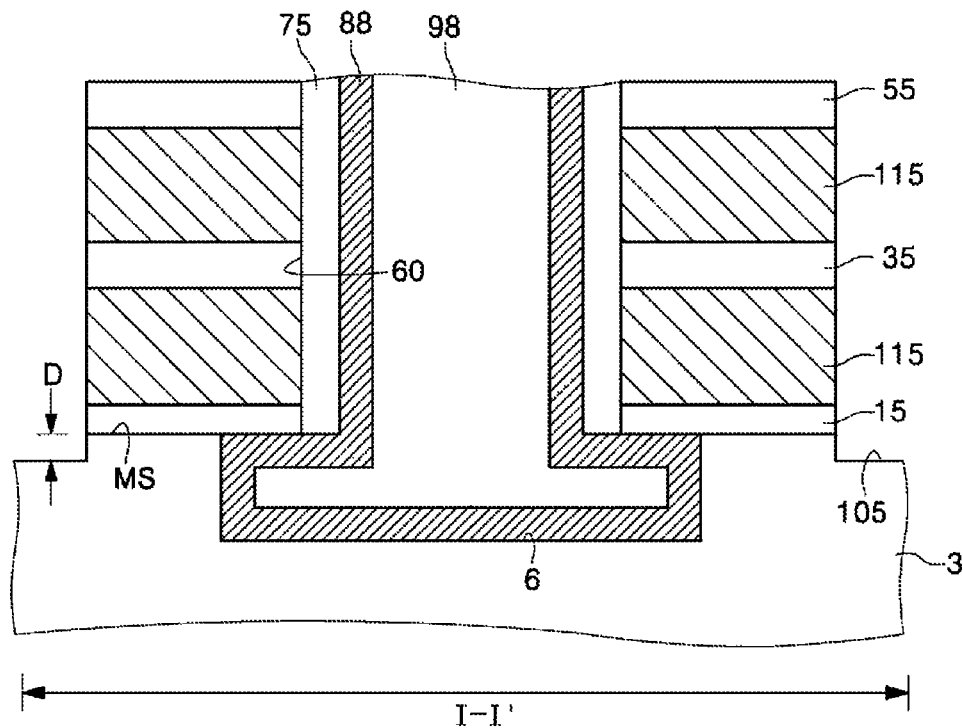
Figure 16B:
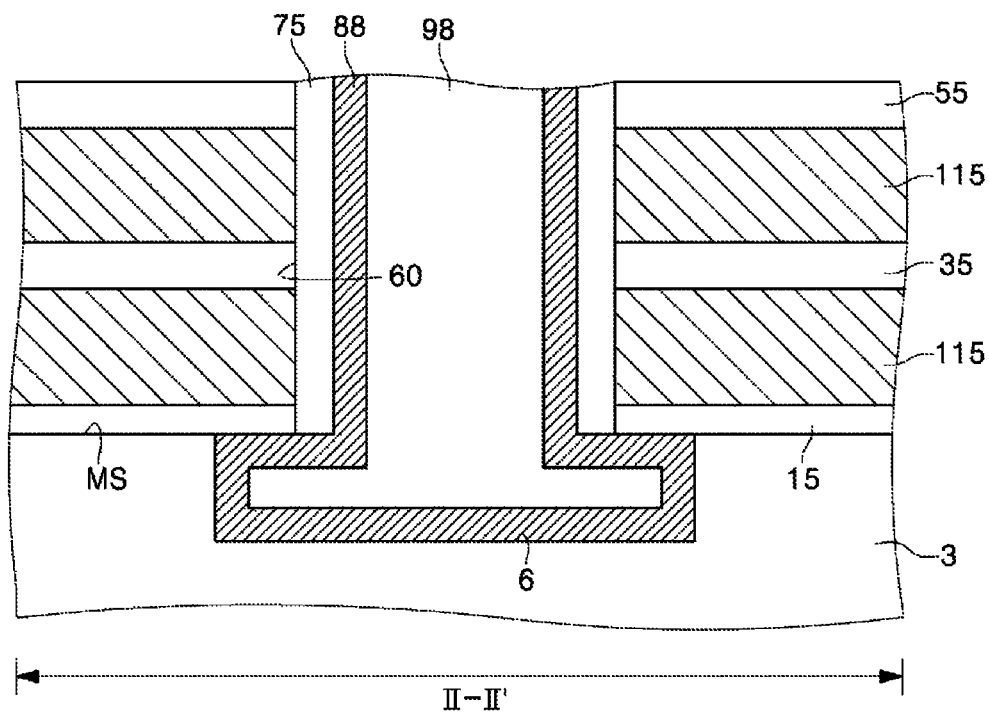

Referring to FIGS. 16A and 16B, the conductive layer 110 is patterned using the second and third insulating layers 35 and 55 as an etch mask or etch buffer layer. As a result, conductive patterns 115 are formed between the first through third insulating patterns 15, 35, and 55. Subsequently, the oxide layer 100 of the semiconductor substrate 3 is removed using the first through third insulating patterns 15, 35, and 55 and the conductive patterns 115 as an etch mask.

After the removal of the oxide layer 100, concave portions 105 are formed in the semiconductor substrate 3 as shown in FIG. 16A. The concave portions 105 may be formed to a given, desired or predetermined depth D below the main surface MS of the semiconductor substrate 3.

Meanwhile, in alternative example embodiments as described in FIGS. 15A and 15B, when a plurality of third insulating patterns 55 are formed on the second insulating pattern 35, the number of the conductive patterns 115 may be equal to the number of spaces provided among the first through third insulating patterns 15, 35, and 55 and between the third insulating patterns 55.

The conductive patterns 115 form a cell string along with the semiconductor substrate 3 and the first through third insulating patterns 15, 35, and 55.

As mentioned above, FIG. 17 is a graph showing an etch rate of an insulating material with respect to a phosphoric acid solution during formation of a cell string according to example embodiments. In FIG. 17, the abscissa denotes a variety of samples A, B, C, and D, and the ordinate denotes an etch rate (Å/min) of a phosphoric acid solution. An experiment was conducted using a solution obtained by diluting about 15% by weight of phosphoric acid with water as an example of the phosphoric acid solution.

Referring to FIG. 17, samples A, B, C, and D were prepared. Sample A includes a silicon oxide film disposed on a single crystalline silicon substrate. Sample B includes a silicon oxynitride film disposed on a single crystalline silicon substrate, and the silicon oxynitride film of the sample B contains nitrogen atoms at about 13 at %. Sample C includes a silicon oxynitride film disposed on a single crystalline silicon substrate, and the silicon oxynitride film of the sample C contains nitrogen atoms at about 21 at %. Sample D on a single crystalline silicon substrate. A phosphoric acid solution was applied to the samples A, B, C, and D.

In the experiment, sample A exhibited an etch rate of about 1.3 Å/min with respect to the phosphoric acid solution. Sample B exhibited an etch rate of about 6.8 Å/min with respect to the phosphoric acid solution. Sample C exhibited an etch rate of about 7.5 Å/min with respect to the phosphoric acid solution. Sample D exhibited an etch rate of about 39.1 Å/min with respect to the phosphoric acid solution.

The phosphoric acid solution exhibited an etching selectivity of at least 5:1 for sample D relative to samples A, B, and C.

FIG. 18 is a graph showing an oxidation rate of a single crystalline semiconductor substrate disposed under an insulating material in an atmosphere of a wet oxidation process during formation of the cell string according to example embodiments. FIG. 18 shows experimental examples of an oxidized thickness of the semiconductor substrate 3 relative to a material of the first insulating pattern 15 of FIGS. 7A and 7B.

More particularly, FIG. 18 shows an oxidation rate of a main surface of the semiconductor substrate 3 disposed directly under the first insulating pattern 15. In FIG. 18, the abscissa denotes a variety of samples A, B, C, D1, D2, and D3, and the ordinate denotes an oxidized thickness (A) of the semiconductor substrate 3.

Referring to FIG. 18, samples A, B, C, D1, D2, and D3 were prepared. Sample A includes a silicon oxide film disposed on a single crystalline silicon substrate. Sample B includes a 100 Å-thick silicon oxynitride film disposed on a single crystalline silicon substrate and the silicon oxynitride film contains nitrogen atoms at about 13 at %. Sample C includes a silicon oxynitride film disposed on a single crystalline silicon substrate, and the silicon oxynitride film contains nitrogen atoms at about 21 at %.

Sample D1 includes a 10 Å-thick silicon nitride film disposed on a single crystalline silicon substrate. Sample D2 includes a 20 Å-thick silicon nitride film disposed on a single crystalline silicon substrate. Sample D3 includes a 40 Å-thick silicon nitride film. A wet oxidation process was performed on samples A, B, C, D1, D2, and D3. According to the experiment, oxidants of the wet oxidation process generated a 408 Å-thick reactant between the single crystalline silicon substrate and the silicon oxide film in sample A. The oxidants of the wet oxidation process generated a 182 Å-thick reactant between the single crystalline silicon substrate and the silicon oxynitride film in sample B. The oxidants of the wet oxidation process generated a 7 Å-thick reactant between the single crystalline silicon substrate and the silicon oxynitride film in sample C. Also, the oxidants of the wet oxidation process generated a 357 Å-thick reactant between the single crystalline silicon substrate and the silicon nitride film in sample D1.

The oxidants of the wet oxidation process generated a 6 Å-thick reactant between the single crystalline silicon substrate and the silicon nitride film in sample D2. Also, the oxidants of the wet oxidation process generated a 0 Å-thick reactant between the single crystalline silicon substrate and the silicon nitride film in sample D3.

Figure 19:
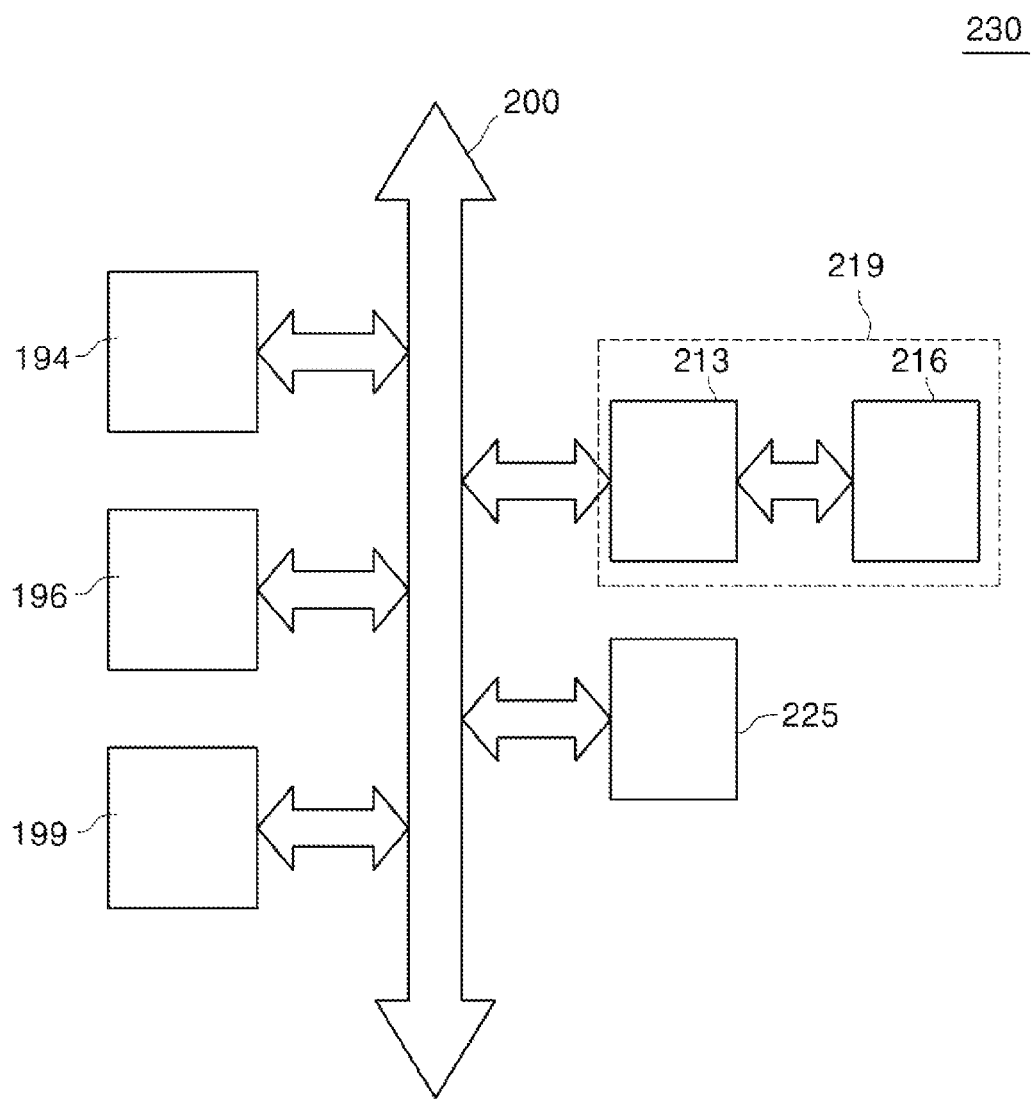
FIG. 19 is a block diagram of an information processing system including a semiconductor device according to an example embodiment.

FIG. 19 is a block diagram of an information processing system including a semiconductor device according to an example embodiment. The semiconductor device is a semiconductor device as described herein and shown, for example, in FIG. 1.

Referring to FIG. 19, the information processing system 230 includes a flash memory system 219. The flash memory system 219 includes a memory controller 213 and a flash memory device 216. Although not shown in FIG. 19, the flash memory device 216 may include a first cell string CSTR0 of FIG. 3. The memory controller 213 electrically contacts the flash memory device 216.

The information processing system 230 further includes a central processing unit (CPU) 194, a random access memory (RAM) 196, a user interface (UI) 199, and a modem 225. The CPU 194, the RAM 196, the UI 199, and the modem 225 are electrically connected to the flash memory system 219 through a bus line 200.

The CPU 194 is configured to execute a program and control the information processing system 230. The UI 199 may include an input/output device configured such that a user is able to input and output data to and from the information processing system 230. The UI 199 may include a touch screen display, a display device and/or a mouse, keyboard or other input device. The modem 225 is configured to exchange electrical signals as well as transmit and receive information external to the information processing system 230. The RAM 185 and/or the flash memory device 216 may be configured to store codes or programs for operating the CPU 194.

The flash memory device 216 and/or the RAM 185 may include the semiconductor device or devices described herein.

The information processing system 230 may embody various systems, such as mobile phones, MP3 players, navigation devices, solid state disks (SSD), laptop and/or desktop computers, household appliances, etc.

According to example embodiments, oxidants used during a wet oxidation process may be suppressed and/or prevented from diffusing into a channel region of a transistor using an insulating pattern contacting a semiconductor substrate. The insulating pattern may include silicon oxynitride (SiON) containing nitrogen atoms between about 13 at % and about 21 at %, inclusive. Thus, relatively little or no reactant (or oxide) may be generated between the oxidants and the semiconductor substrate under the insulating pattern so that the transistor may have desired current drivability.

Semiconductor devices according to example embodiments may include ground selection transistors, memory cell transistors, and string selection transistors sequentially stacked on a semiconductor substrate. In each of the ground selection transistors, an insulating pattern contacting a semiconductor substrate may correspond to silicon oxynitride containing nitrogen atoms between about 13 at % and 21 at %, inclusive. Thus, the semiconductor devices may maintain desired electrical reliability using the ground selection transistors.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of inventive concepts as defined in the claims. In the claims, means-plus-function clauses are intended to cover the structures described herein as performing the recited function, and not only structural equivalents, but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
an insulating pattern disposed on a surface of a semiconductor substrate and including a silicon oxynitride film;
a conductive pattern disposed on the insulating pattern;
a data storage pattern and a vertical channel pattern disposed within a channel hole formed to vertically penetrate the insulating pattern and the conductive pattern, the data storage pattern and the vertical channel pattern being conformally stacked along sidewalls of the insulating pattern and the conductive pattern; and
a concave portion formed in the semiconductor substrate adjacent to the insulating pattern,
wherein a side of the concave portion is vertically aligned with a side of the insulating pattern.

2. The device of claim 1, wherein the insulating pattern includes a lower silicon oxide film disposed under the silicon oxynitride film.

3. The device of claim 2, wherein the insulating pattern includes an upper silicon oxide film disposed above the silicon oxynitride film.

4. The device of claim 3, wherein the insulating pattern includes a silicon nitride film.

5. The device of claim 1, wherein the silicon oxynitride film includes nitrogen atoms at greater than or equal to about 13 atomic weight percent (at %).

6. The device of claim 5, wherein the silicon oxynitride film includes nitrogen atoms at less than or equal to about 21 at %.

7. The device of claim 6, wherein the silicon oxynitride film is formed to a thickness of less than or equal to about 100 Å.

8. The device of claim 1,
wherein the concave portion is recessed relative to a bottom surface of the insulating pattern, and is spaced apart from the channel hole.

9. The device of claim 1, wherein the data storage pattern and the vertical channel pattern directly contact the surface of the semiconductor substrate.

10. The device of claim 1, wherein the data storage pattern is disposed on the semiconductor substrate, and the vertical channel pattern extends below the surface of the semiconductor substrate.

11. A semiconductor device comprising:
a ground selection transistor disposed on a semiconductor substrate;
a plurality of memory cell transistors stacked on the ground selection transistor;
a string selection transistor disposed on the plurality of memory cell transistors;
a bit line disposed on the string selection transistor;
an insulating pattern disposed between the semiconductor substrate and the ground selection transistor, the insulating pattern including silicon oxynitride; and
a concave portion formed in the semiconductor substrate adjacent to the insulating pattern, wherein a side of the concave portion is vertically aligned with a side of the insulating pattern.

12. The device of claim 11, further comprising:
a data storage pattern, a vertical channel pattern, and an insulating filling pattern configured to fill a channel hole penetrating the string selection transistor, the plurality of memory cell transistors, and the ground selection transistor.

13. The device of claim 12, wherein the concave portion is formed in a source region of the ground selection transistor.

14. The device of claim 13, wherein a portion of the semiconductor substrate formed under the insulating pattern is a channel region of the ground selection transistor.

15. The device of claim 14, wherein a portion of the vertical channel pattern is a drain region of the ground selection transistor.

16. A semiconductor device comprising:
a stack structure including a silicon oxynitride layer and a conductive layer formed sequentially on a surface of a semiconductor substrate, the stack structure having a channel hole formed through the silicon oxynitride layer and the conductive layer;
a data storage layer formed on sidewalls of the channel hole;
a vertical channel layer formed on the data storage layer; and
a concave portion formed in the semiconductor substrate adjacent to the stack structure,
wherein a side of the concave portion is vertically aligned with a side of the stack structure.

17. The device of claim 16, wherein the silicon oxynitride layer includes nitrogen atoms at greater than or equal to about 13 atomic weight percent (at %).

18. The device of claim 16, wherein the silicon oxynitride layer includes nitrogen atoms at less than or equal to about 21 at %.

19. The device of claim 16, wherein the silicon oxynitride layer includes nitrogen atoms between about 13 at % and about 21 at %, inclusive.

20. The device of claim 16, wherein the silicon oxynitride layer is in direct contact with the surface of the semiconductor substrate and the conductive layer.

* * * * *